(12) United States Patent
Kumar et al.

(10) Patent No.: US 10,526,700 B2
(45) Date of Patent: *Jan. 7, 2020

(54) HARDWARE AND PROCESS FOR FILM UNIFORMITY IMPROVEMENT

(71) Applicant: Lam Research Corporation, Fremont, CA (US)

(72) Inventors: Purushottam Kumar, Hillsboro, OR (US); Hu Kang, Tualatin, OR (US); Adrien LaVoie, Newberg, OR (US); Yi Chung Chiu, Taipei (TW); Frank L. Pasquale, Beaverton, OR (US); Jun Qian, Sherwood, OR (US); Chloe Baldasseroni, Tigard, OR (US); Shankar Swaminathan, Beaverton, OR (US); Karl F. Leeser, West Linn, OR (US); David Charles Smith, Lake Oswego, OR (US); Wei-Chih Lai, Yilan County (TW)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/130,919

(22) Filed: Sep. 13, 2018

(65) Prior Publication Data

US 2019/0040528 A1    Feb. 7, 2019

Related U.S. Application Data

(63) Continuation of application No. 14/578,166, filed on Dec. 19, 2014, now Pat. No. 10,100,407.

(51) Int. Cl.
    *C23C 16/455*    (2006.01)

(52) U.S. Cl.
    CPC .. *C23C 16/45527* (2013.01); *C23C 16/45519* (2013.01); *C23C 16/45536* (2013.01); *C23C 16/45544* (2013.01); *C23C 16/45561* (2013.01)

(58) Field of Classification Search
    USPC ........ 427/255.23, 255.28; 118/696, 699, 663
    See application file for complete search history.

(56) References Cited

U.S. PATENT DOCUMENTS 5,338,389 A * 8/1994 Nishizawa ............. C30B 25/02
                                                    117/89
5,368,685 A * 11/1994 Kumihashi ....... H01J 37/32082
                                                    156/345.26

(Continued)

FOREIGN PATENT DOCUMENTS

CN      105714272       6/2016
JP      2007-537605 A   12/2007

(Continued)

OTHER PUBLICATIONS

Chinese First Office Action dated Nov. 6, 2017, issued in Application No. CN 201510969185.1.

(Continued)

*Primary Examiner* — Rudy Zervigon
(74) *Attorney, Agent, or Firm* — Weaver Austin Villeneuve & Sampson LLP

(57) ABSTRACT

The present inventors have conceived of a multi-stage process gas delivery system for use in a substrate processing apparatus. In certain implementations, a first process gas may first be delivered to a substrate in a substrate processing chamber. A second process gas may be delivered, at a later time, to the substrate to aid in the even dosing of the substrate. Delivery of the first process gas and the second process gas may cease at the same time or may cease at separate times.

28 Claims, 20 Drawing Sheets

(56) References Cited

U.S. PATENT DOCUMENTS

| | | | | |
|---|---|---|---|---|
| 5,395,453 A * | 3/1995 | Noda | | H01J 37/32192 118/723 ME |
| 5,500,256 A * | 3/1996 | Watabe | | C23C 16/45561 427/579 |
| 5,769,950 A * | 6/1998 | Takasu | | C23C 16/4408 118/715 |
| 5,888,907 A * | 3/1999 | Tomoyasu | | H01J 37/3244 438/714 |
| 6,143,659 A * | 11/2000 | Leem | | C23C 16/06 438/688 |
| 6,287,965 B1 * | 9/2001 | Kang | | C23C 16/34 257/E21.021 |
| 6,287,980 B1 * | 9/2001 | Hanazaki | | H01J 37/3244 156/345.28 |
| 6,534,395 B2 * | 3/2003 | Werkhoven | | C23C 16/029 257/E21.171 |
| 6,787,481 B2 * | 9/2004 | Asai | | C23C 16/405 438/785 |
| 6,838,114 B2 * | 1/2005 | Carpenter | | C23C 16/52 427/248.1 |
| 6,960,537 B2 * | 11/2005 | Shero | | C23C 16/308 438/775 |
| 7,011,710 B2 * | 3/2006 | Bang | | C23C 16/401 118/715 |
| 7,273,526 B2 * | 9/2007 | Shinriki | | C23C 16/34 118/715 |
| 7,344,755 B2 * | 3/2008 | Beaman | | C23C 16/4404 427/248.1 |
| 7,439,191 B2 * | 10/2008 | Law | | C23C 16/24 438/758 |
| 7,481,887 B2 * | 1/2009 | Carpenter | | C23C 16/45525 118/712 |
| 7,666,479 B2 * | 2/2010 | Strang | | C23C 16/45523 118/663 |
| 7,674,393 B2 * | 3/2010 | Tahara | | H01J 37/32935 156/345.24 |
| 7,699,932 B2 * | 4/2010 | Miller | | C23C 16/45544 118/715 |
| 7,740,704 B2 * | 6/2010 | Strang | | C23C 16/402 118/695 |
| 7,771,535 B2 * | 8/2010 | Koyanagi | | C23C 16/4412 118/715 |
| 7,883,581 B2 * | 2/2011 | Nakaiso | | C23C 16/345 118/715 |
| 7,906,393 B2 * | 3/2011 | Zheng | | H01L 21/3141 438/255 |
| 8,235,001 B2 * | 8/2012 | Sano | | C23C 16/4408 118/696 |
| 8,304,021 B2 * | 11/2012 | Yamamoto | | C23C 16/30 118/666 |
| 8,366,868 B2 * | 2/2013 | Okuda | | C23C 16/4405 118/695 |
| 8,366,869 B2 * | 2/2013 | Nozawa | | C23C 16/45502 118/695 |
| 8,397,668 B2 * | 3/2013 | Kobayashi | | H01J 37/32082 118/715 |
| 8,590,484 B2 * | 11/2013 | Sato | | C23C 16/34 118/695 |
| 8,637,411 B2 | 1/2014 | Swaminathan et al. | | |
| 8,728,956 B2 | 5/2014 | LaVoie et al. | | |
| 8,945,339 B2 * | 2/2015 | Kakimoto | | C23C 16/0272 118/696 |
| 8,956,983 B2 | 2/2015 | Swaminathan et al. | | |
| 9,127,358 B2 * | 9/2015 | Inoue | | C23C 16/4481 |
| 9,171,734 B1 * | 10/2015 | Toyoda | | H01L 21/3065 |
| 9,234,276 B2 | 1/2016 | Varadarajan | | |
| 9,371,579 B2 | 6/2016 | Varadarajan et al. | | |
| 2001/0000866 A1 * | 5/2001 | Sneh | | C23C 16/44 118/723 R |
| 2002/0043215 A1 * | 4/2002 | Yoshioka | | B01D 1/0082 118/715 |
| 2002/0092281 A1 * | 7/2002 | Choi | | C23C 16/42 55/385.1 |
| 2002/0160125 A1 * | 10/2002 | Johnson | | H01J 37/32082 427/569 |
| 2002/0192369 A1 * | 12/2002 | Morimoto | | C23C 16/14 427/248.1 |
| 2003/0000924 A1 * | 1/2003 | Strang | | C23C 16/45523 216/86 |
| 2003/0070617 A1 * | 4/2003 | Kim | | C23C 16/34 118/715 |
| 2003/0219528 A1 * | 11/2003 | Carpenter | | C23C 16/45525 427/8 |
| 2004/0212114 A1 * | 10/2004 | Kashiwagi | | C23C 16/401 264/30 |
| 2005/0069632 A1 * | 3/2005 | Yamasaki | | C23C 16/045 427/123 |
| 2005/0115501 A1 * | 6/2005 | Toriya | | C23C 16/4402 118/715 |
| 2005/0145333 A1 * | 7/2005 | Kannan | | C23C 16/4412 156/345.24 |
| 2005/0155551 A1 * | 7/2005 | Bae | | C23C 16/4481 118/715 |
| 2005/0233093 A1 * | 10/2005 | Tada | | C23C 16/4408 427/569 |
| 2005/0241763 A1 * | 11/2005 | Huang | | C23C 16/45561 156/345.33 |
| 2005/0249876 A1 * | 11/2005 | Kawahara | | C23C 16/45514 427/255.34 |
| 2005/0268853 A1 * | 12/2005 | Yamamoto | | C23C 16/30 118/726 |
| 2006/0128127 A1 * | 6/2006 | Seo | | C23C 16/34 438/584 |
| 2008/0075858 A1 * | 3/2008 | Koh | | C23C 16/06 427/255.28 |
| 2008/0241381 A1 * | 10/2008 | Suzuki | | C23C 16/0209 427/255.28 |
| 2008/0264337 A1 * | 10/2008 | Sano | | C23C 16/4408 118/704 |
| 2009/0004877 A1 * | 1/2009 | Asai | | C23C 16/4405 438/758 |
| 2010/0015800 A1 * | 1/2010 | Hara | | C23C 16/16 438/653 |
| 2010/0291763 A1 * | 11/2010 | Ogawa | | C23C 16/405 438/584 |
| 2011/0236594 A1 * | 9/2011 | Haverkamp | | C23C 16/24 427/553 |
| 2011/0256726 A1 * | 10/2011 | LaVoie | | C23C 16/045 438/702 |
| 2012/0009802 A1 | 1/2012 | LaVoie et al. | | |
| 2012/0183689 A1 * | 7/2012 | Suzuki | | C23C 16/18 427/250 |
| 2012/0305188 A1 * | 12/2012 | Kato | | H01J 37/3244 156/345.26 |
| 2013/0309876 A1 * | 11/2013 | Ogawa | | C23C 16/08 438/758 |
| 2013/0330935 A1 | 12/2013 | Varadarajan | | |
| 2014/0045278 A1 * | 2/2014 | Yoshida | | C23C 16/4408 438/5 |
| 2014/0087565 A1 * | 3/2014 | Yamaguchi | | C23C 16/4401 438/758 |
| 2015/0152551 A1 * | 6/2015 | Yamaguchi | | C23C 16/45565 438/785 |
| 2015/0249013 A1 | 9/2015 | Arghavani et al. | | |
| 2015/0354059 A1 * | 12/2015 | Kang | | C23C 16/45523 427/569 |
| 2016/0047039 A1 * | 2/2016 | Hirose | | C23C 16/45544 118/697 |
| 2016/0056032 A1 * | 2/2016 | Baldasseroni | | H01L 21/0228 438/778 |
| 2016/0056035 A1 * | 2/2016 | Toyoda | | H01L 21/3065 438/778 |
| 2016/0086801 A1 * | 3/2016 | Kitamura | | H01L 21/02568 438/478 |

(56) References Cited

U.S. PATENT DOCUMENTS

FOREIGN PATENT DOCUMENTS

| JP | 2008-277762 A | 11/2008 |
| JP | 2011-132568 A | 7/2011 |
| JP | 2013-249511 A | 12/2013 |
| JP | 2016-046415 A | 4/2016 |
| JP | 2016-145412 | 8/2016 |

OTHER PUBLICATIONS

Notice of Allowance, Chinese Patent Application No. 201510969185.1, dated Aug. 3, 2018.
U.S. Restriction Requirement dated Apr. 28, 2016, issued in U.S. Appl. No. 14/578,166.
U.S. Non-Final Office Action dated May 31, 2016, issued in U.S. Appl. No. 14/578,166.
U.S. Final Office Action dated Sep. 29, 2016, issued in U.S. Appl. No. 14/578,166.
U.S. Final Office Action dated Mar. 18, 2017, issued in U.S. Appl. No. 14/578,166.
U.S. Non-Final Office Action dated Sep. 22, 2017, issued in U.S. Appl. No. 14/578,166.
U.S. Final Office Action dated Mar. 1, 2018, issued in U.S. Appl. No. 14/578,166.
U.S. Notice of Allowance dated May 29, 2018, issued in U.S. Appl. No. 14/578,166.
JP Office Action dated Nov. 12, 2019 in JP Application No. 2015-241657.

\* cited by examiner

HARDWARE AND PROCESS FOR FILM UNIFORMITY IMPROVEMENT

CROSS-REFERENCE TO RELATED APPLICATIONS

This application is a continuation of, and claims priority to, U.S. patent application Ser. No. 14/578,166, filed Dec. 19, 2014, and titled "HARDWARE AND PROCESS FOR FILM UNIFORMITY IMPROVEMENT," which is herein incorporated by reference in its entirety and for all purposes.

BACKGROUND

Current deposition processes flow carrier gas and precursor through a showerhead or other process gas delivery apparatus to deliver the precursor onto a substrate. The substrate may be held within a substrate processing chamber. The flow of process gas within the substrate processing chamber, along with other factors, may result in uneven dosing of the substrate. Unevenly dosed substrates may affect the quality of processed substrates.

SUMMARY

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In certain implementations, a method of controlling a precursor dose to a substrate during a deposition process may be provided. The method may include: (a) flowing a first process gas to the substrate for a first period of a dose phase of an ALD deposition cycle such that the first process gas includes a first carrier gas and the precursor, (b) flowing a second process gas for a second period of the dose phase of the ALD deposition cycle to the substrate such that the second period begins after the first period begins, the first and second periods at least partially overlap, the second process gas includes a second carrier gas, and the second process gas mixes with the first process gas before delivery to the substrate for at least a portion of a period where the second period overlaps with the first period, and the volumetric flow rate of total process gas increases from (a) to (b), (c) stopping the flows in (a) and (b), and (d) after (c), repeating (a) and (b) for the substrate during an ALD deposition cycle different from the ALD deposition cycle in (a) and (b).

In some such implementations of the method, at least a portion of the first process gas may be adsorbed onto the substrate and the method may further include, after (c) and before (d), reacting the adsorbed precursor to form a film layer on the substrate. In some implementations of the method, reacting the adsorbed precursor may be performed when the substrate is not fully saturated with adsorbed precursor.

In some further or additional implementations of the method, the second process gas may not contain the precursor.

In some further or additional implementations of the method, the first period may finish after the second period finishes.

In some further or additional implementations of the method, the second period may finish after the first period finishes. In some implementations of the method, the process gas delivered during the portion of the second period that continues after the first period has finished removes at least some unadsorbed precursor from a volume surrounding the substrate.

In some further or additional implementations of the method, the first process gas may be delivered via a first flow path, the second process gas may be delivered via a second flow path, the second flow path may be fluidically connected to the first flow path, and the second process gas may mix with the first process gas in at least a portion of the first flow path.

In some further or additional implementations of the method, (a) to (c) may be performed in a period of about 5 seconds or less.

In some further or additional implementations of the method, the substrate may be about 450 mm in diameter or less.

In some further or additional implementations of the method, the method may further include: (e) after (a), flowing a third process gas for a third period of the dose phase of the ALD deposition to the substrate such that the third period begins after the first period begins, the first and third periods at least partially overlap, the third process gas includes a third carrier gas, the third process gas mixes with at least the first process gas before delivery to the substrate for at least a portion of a period where the third period that overlaps with the first period, and the volumetric flow rate of total process gas increases from (a) to (e).

In some further or additional implementations of the method, the second carrier gas may be selected from the group consisting of: the first carrier gas and a carrier gas different from the first carrier gas.

In certain implementations, an apparatus may be presented. The apparatus may include: a substrate holder configured to receive a substrate, a showerhead with a showerhead inlet, configured to deliver process gas to the substrate received by the substrate holder, a first flow path with a first valve, fluidly connected to the showerhead inlet, a second flow path with a second valve, fluidly connected to the first flow path, and one or more controllers. The one or more controllers may be configured to: (a) switch the first valve to a flow on position to flow a first process gas to the substrate for a first period of a dose phase of an ALD deposition cycle, where the first process gas includes a first carrier gas and precursor, (b) switch the second valve to a flow on position to flow a second process gas to the substrate for a second period of the dose phase of the ALD deposition cycle, where the second period beings after the first period begins, the first and second periods at least partially overlap, the second process gas includes the carrier gas, the second process gas mixes with the first process gas for at least a portion of a period where the second period overlaps with the first period, and the volumetric flow rate of total process gas increases from (a) to (b), (c) after (a), switch the first valve to a flow off position to cease flowing the first process gas to the substrate, (d) after (b), switch the second valve to a flow off position to cease flowing the second process gas to the substrate, and (e) after (c) and (d), repeating (a) and (b) for the substrate during an ALD deposition cycle different from the ALD deposition cycle in (a) and (b).

In some such implementations of the apparatus, at least a portion of the first process gas may be adsorbed onto the substrate and the one or more controllers may be further configured to: (f) after (c) and (d) and before (e), reacting the adsorbed precursor to form a film layer on the substrate. In some implementations of the apparatus, when operation (f) begins, the substrate may not be fully saturated with adsorbed precursor.

In some further or additional implementations of the apparatus, the one or more controllers may be further configured to charge the second flow path with the second process gas when the first valve is open and the second valve is closed. In some implementations of the apparatus, the apparatus may further include a diverter path, fluidically connected to the second flow path and the one or more controllers may be further configured to: (f) flow the second process gas from the second flow path through the diverter path when the second valve is in the flow off position. In some such implementations, the apparatus may further include a diverter valve within the diverter path and (f) may include switching the diverter valve to a flow on position when the second valve is switched to a flow off position.

In some further or additional implementations of the apparatus, the second flow path may terminate into the first flow path and the second process gas may mix with the first process gas in at least a portion of the first flow path downstream of where the second flow path terminates into the first flow path.

In some further or additional implementations of the apparatus, the first period may finish after the second period finishes.

In some further or additional implementations of the apparatus, the second period may finish after the first period finishes. In some such implementations the process gas delivered during the portion of the second period that continues after the first period has finished may be used to remove at least some unadsorbed precursor from a volume surrounding the substrate.

In some further or additional implementations of the apparatus, the one or more controllers may be configured to perform (a) to (d) in a period of about 5 seconds or less.

In some further or additional implementations of the apparatus, the substrate is about 450 mm in diameter or less.

In some further or additional implementations of the apparatus, the apparatus may further include a third flow path with a third valve, fluidly connected to the first flow path, such that the one or more controllers may be further configured to: (f) switch the third valve to a flow on position to flow a third process gas to the substrate for a third period of the dose phase of the ALD deposition cycle such that the third period begins after the first period begins, the first and third periods at least partially overlap, the third process gas includes a third carrier gas, the third process gas mixes with at least the first process gas for at least a portion of a period where the third period overlaps with the first period, and the volumetric flow rate of total process gas increases from (a) to (f), and (g) after (f), switch the third valve to a flow off position to cease flowing the third process gas to the substrate.

In some further or additional implementations of the apparatus, the second carrier gas may be selected from the group consisting of: the first carrier gas and a carrier gas different from the first carrier gas.

In some further or additional implementations of the apparatus, the apparatus may further include a precursor source, fluidically connected to the first flow path and configured to provide the precursor of the first process gas and a carrier gas source, fluidically connected to at least the first flow path and configured to provide at least the first carrier gas of the first process gas. In some such implementations, the carrier gas source may additionally be fluidically connected to the second flow path and configured to provide the second carrier gas of the second process gas.

In some further or additional implementations of the apparatus, at least the flow of the second process gas in (b) may not be controlled by a mass flow controller.

These and other features of the invention will be described in more detail below with reference to the drawings.

DETAILED DESCRIPTION

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

It is to be understood that, as used herein, the term "semiconductor wafer" may refer both to wafers that are made of a semiconductor material, e.g., silicon, and wafers that are made of materials that are not generally identified as semiconductors, e.g., dielectrics and/or conductors, but that typically have semiconductor materials provided on them. Silicon on insulator (SOI) wafers are one such example. The apparatuses and methods described in this disclosure may be used in the processing of semiconductor wafers of multiple sizes, including 200 mm, 300 mm, and 450 mm diameter semiconductor wafers.

Figure 1:
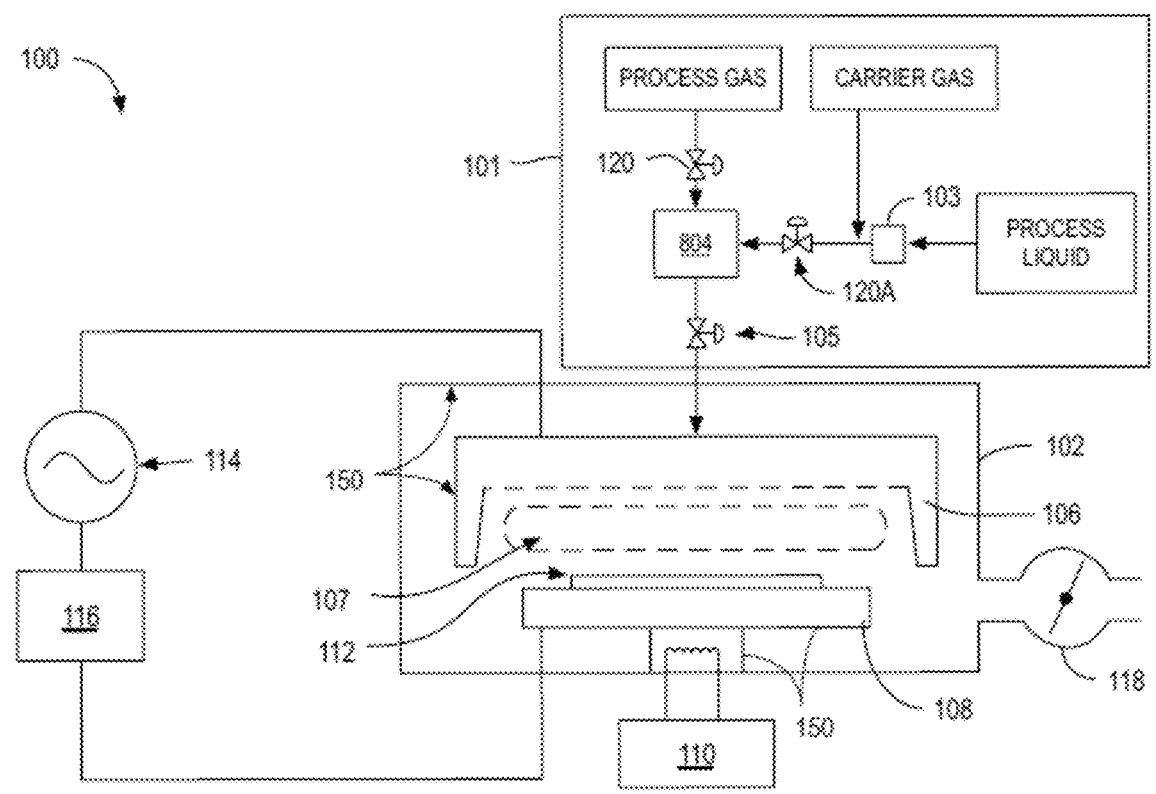
FIG. 1 is a schematic of a substrate processing apparatus having a processing chamber with a single process station.

Operations for depositing films on semiconductor substrates may generally be performed in a substrate processing apparatus like that shown in FIG. 1. FIG. 1 is a schematic of a substrate processing apparatus having a processing chamber with a single process station.

For simplicity, processing apparatus 100 is depicted as a standalone process station having a process chamber body 102 for maintaining a low-pressure environment. However, it will be appreciated that a plurality of process stations may be included in a common process tool environment—e.g., within a common reaction chamber. Further, it will be appreciated that, in some implementations, one or more hardware parameters of processing apparatus 100, including those discussed herein, may be adjusted programmatically by one or more system controllers.

In some implementations, a controller may be a part of a system, which may be part of the examples described herein. Such systems may comprise semiconductor processing equipment, including a processing tool or tools, chamber or chambers, a platform or platforms for processing, precursor delivery equipment, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Referring back to FIG. 1, process station 100 fluidly communicates with reactant delivery system 101 for delivering process gases to a distribution showerhead 106. Reactant delivery system 101 includes a mixing vessel 104 for blending and/or conditioning process gases for delivery to showerhead 106. One or more mixing vessel inlet valves 120 may control introduction of process gases to mixing vessel 104.

Some reactants may be stored in liquid form prior to vaporization and subsequent delivery to the process chamber 102. The implementation of FIG. 1A includes a vaporization point 103 for vaporizing liquid reactant to be supplied to mixing vessel 104. In some implementations, vaporization point 103 may be a heated liquid injection module. In some additional implementations, vaporization point 103 may be a heated vaporizer.

In some implementations, a liquid flow controller (LFC) upstream of vaporization point 103 may be provided for controlling a mass flow of liquid for vaporization and delivery to processing chamber 102. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 106 distributes process gases and/or reactants (e.g., film precursors) toward substrate 112 at the process station, the flow of which is controlled by one or more valves upstream from the showerhead (e.g., valves 120, 120A, 105). In the implementation shown in FIG. 1, substrate 112 is located beneath showerhead 106, and is shown resting on a pedestal 108. It will be appreciated that showerhead 106 may have any suitable shape, and may have any suitable number and arrangement of ports for distributing processes gases to substrate 112.

In some implementations, a microvolume 107 is located beneath showerhead 106. Performing a deposition process, such as an ALD process, in a microvolume in the process station near the substrate rather than in the entire volume of a processing chamber may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some implementations, pedestal 108 may be raised or lowered to expose substrate 112 to microvolume 107 and/or to vary a volume of microvolume 107. For example, in a substrate transfer phase, pedestal 108 may be lowered to allow substrate 112 to be loaded onto pedestal 108. During a deposition on substrate process phase, pedestal 108 may be raised to position substrate 112 within microvolume 107. In some implementations, microvolume 107 may completely enclose substrate 112 as well as a portion of pedestal 108 to create a region of high flow impedance during a deposition process.

Optionally, pedestal 108 may be lowered and/or raised during portions the deposition process to modulate process pressure, reactant concentration, etc. within microvolume 107. In one scenario where processing chamber body 102 remains at a base pressure during the process, lowering pedestal 108 may allow microvolume 107 to be evacuated. It will be appreciated that, in some implementations, pedestal height may be adjusted programmatically by a suitable system controller.

While the example microvolume variations described herein refer to a height-adjustable pedestal, it will be appreciated that, in some implementations, a position of showerhead 806 may be adjusted relative to pedestal 108 to vary a volume of microvolume 107. Further, it will be appreciated that a vertical position of pedestal 108 and/or showerhead 106 may be varied by any suitable mechanism within the scope of the present disclosure. In some implementations, pedestal 108 may include a rotational axis for rotating an orientation of substrate 112. It will be appreciated that, in some implementations, one or more of these example adjustments may be performed programmatically by one or more suitable system controllers having machine-readable instructions for performing all or a subset of the foregoing operations.

Additionally, in FIG. 1, showerhead 106 and pedestal 108 electrically communicate with RF power supply 114 and matching network 116 for powering a plasma. In some implementations, the plasma energy may be controlled (e.g., via a system controller having appropriate machine-readable instructions) by controlling one or more of a process station pressure, a gas concentration, an RF source power, an RF source frequency, and a plasma power pulse timing. For example, RF power supply 114 and matching network 116 may be operated at any suitable power to form a plasma having a desired composition of radical species. Likewise, RF power supply 114 may provide RF power of any suitable frequency. In some implementations, RF power supply 114 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some implementations, pedestal 108 may be temperature controlled via heater 110. Further, in some implementations, pressure control for processing apparatus 100 may be provided by one or more valve-operated vacuum sources such as butterfly valve 118. As shown in the implementation of FIG. 1, butterfly valve 118 throttles a vacuum provided by a downstream vacuum pump (not shown). However, in some implementations, pressure control of processing apparatus 100 may also be adjusted by varying a flow rate of one or more gases introduced to processing chamber 102. In some implementations, the one or more valve-operated vacuum sources—such as butterfly valve 118—may be used for removing film precursor from the volumes surrounding the process stations during the appropriate ALD operational phases.

The processing apparatus 100 may be coupled to facilities (not shown) when installed in a clean room or a fabrication facility. Facilities may include plumbing that provide processing gases, vacuum, temperature control, and environmental particle control. In certain implementations, the techniques and processes detailed herein may be performed at ambient temperatures of less than 50 degrees Celsius, less than 100 degrees Celsius, less than 200 degrees Celsius, or at any temperature suited for processing substrates, detecting defects, or identifying defects. These facilities may be coupled to the processing apparatus 100, when installed in the fabrication facility. Additionally, the processing apparatus 100 may be coupled to a transfer chamber that allows robotics to transfer semiconductor wafers into and out of the processing apparatus 100 using typical automation.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, laser metrology device, electron generating equipment, and any other semiconductor processing systems that may be associated or used in substrate defect detection or identification.

In some implementations, there may be a user interface associated with the system controller. The user interface may include a display screen, graphical software displays of the apparatus and/or process conditions, and user input devices such as pointing devices, keyboards, touch screens, microphones, etc.

Figure 2:
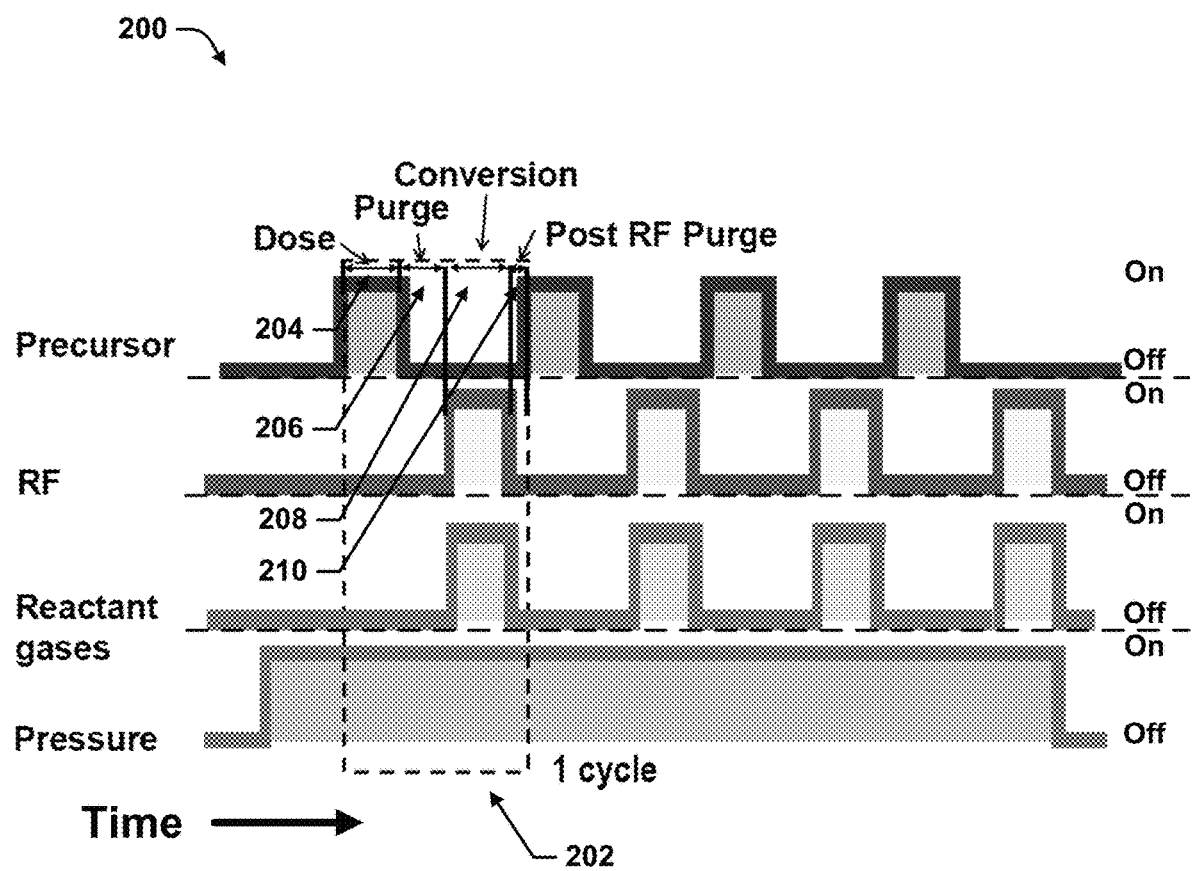
FIG. 2 is a chart showing basic sequence of operations for forming films of material on a substrate via deposition processes.

The basic sequence of operations for forming films of material on a substrate via deposition processes, such as ALD processes, with equipment such as the substrate processing apparatus described in FIG. 1, is illustrated in FIG. 2. FIG. 2 is a chart showing basic sequence of operations for forming films of material on a substrate via deposition processes. FIG. 2 illustrates the process steps for four deposition cycles, with each cycle including the process steps of precursor delivery, RF power delivery, reactant gas delivery, and pressurization of the processing chamber. In certain implementations, each deposition cycle illustrated in FIG. 2 may be performed within a period of less than 100 milliseconds, 1 second, 2 seconds, 5 seconds, or 10 seconds. The process steps in FIG. 2 are shown through their corresponding lines and are presented as Boolean values, either on or off. A process step is on if its corresponding line is in the "on" position illustrated in FIG. 2 and a process step is off if its corresponding line is in the "off" position illustrated in FIG. 2.

During all four deposition cycles, the processing chamber may be pressurized. A deposition cycle 202 is highlighted in FIG. 2. In the deposition cycle 202, the first phase of the deposition cycle may be a dose phase 204. During the dose phase 204, the precursor is delivered to the processing chamber, but the RF power is off and reactant gas or gases are not delivered. During the dose phase 204, the substrate may adsorb the precursor and form an adsorption layer on the substrate.

After the dose phase 204, there may then be a purge phase 206 of the deposition cycle 202. During the purge phase 206, precursor delivery stops, but the RF power is still off and reactant gases are still not delivered. The purge phase 206 may remove at least some unadsorbed film precursor and/or reactant byproduct from the volume surrounding the adsorbed precursor.

After the purge phase 206, the deposition cycle 202 may then enter the conversion phase 208. During the conversion phase 208, RF power is turned on while the reactant gas or gases are also delivered. During the conversion phase 208, the adsorbed film precursor may be reacted to form a film layer on the substrate.

Finally, after the conclusion of the conversion phase 208, the deposition cycle 202 may enter the post RF purge phase 210. The post RF purge 210 phase may remove any present desorbed film precursor and/or reaction byproduct from the volume surrounding the film layer after reacting the adsorbed precursor.

In certain implementations, the dose phase may be concluded before a substrate has been fully saturated with precursor. Such implementations may allow for a shorter processing time per deposition cycle, which may lead to higher substrate throughput. This may be especially true for ALD processes, which typically have tens or hundreds of deposition cycles per processing step and thus any time saved per deposition cycle is multiplied by the number of cycles. However, in such implementations, the substrate may be unevenly dosed as the substrate is not fully saturated with precursor. Substrates that are unevenly dosed may be non-uniform when processed, with certain parts of the substrate having a greater thickness than other parts of the substrate. Non-uniform substrates may affect the quality of processed substrates.

In some implementations, a multi-layer deposited film may include regions/portions of alternating composition formed, for example, by conformally depositing multiple layers sequentially having one composition, and then conformally depositing multiple layers sequentially having another composition, and then potentially repeating and alternating these two sequences. Some of these aspects of deposited ALD films are described, for example, in U.S. patent application Ser. No. 13/607,386, filed Sep. 7, 2012, and titled "CONFORMAL DOPING VIA PLASMA ACTIVATED ATOMIC LAYER DEPOSITION AND CONFORMAL FILM DEPOSITION", which is incorporated by reference herein in its entirety for all purposes. Further examples of conformal films having portions of alternating composition—including films used for doping an underlying target IC structure or substrate region—as well as methods of forming these films, are described in detail in: U.S. patent application Ser. No. 13/084,399, filed Apr. 11, 2011, and titled "PLASMA ACTIVATED CONFORMAL FILM DEPOSITION"; U.S. patent application Ser. No. 13/242,084, filed Sep. 23, 2011, and titled "PLASMA ACTIVATED CONFORMAL DIELECTRIC FILM DEPOSITION," now U.S. Pat. No. 8,637,411; U.S. patent application Ser. No. 13/224,240, filed Sep. 1, 2011, and titled "PLASMA ACTIVATED CONFORMAL DIELECTRIC FILM DEPOSITION"; U.S. patent application Ser. No. 13/607,386, filed Sep. 7, 2012, and titled "CONFORMAL DOPING VIA PLASMA ACTIVATED ATOMIC LAYER DEPOSITION AND CONFORMAL FILM DEPOSITION"; and U.S. patent application Ser. No. 14/194,549, filed Feb. 28, 2014, and titled "CAPPED ALD FILMS FOR DOPING FIN-SHAPED CHANNEL REGIONS OF 3-D IC TRANSISTORS"; each of which is incorporated by reference herein in its entirety for all purposes.

As detailed in the above referenced specifications, ALD processes are oftentimes used to deposit conformal silicon oxide films (SiOx), however ALD processes may also be used to deposit conformal dielectric films of other chemistries as also disclosed in the foregoing incorporated specifications. ALD-formed dielectric films may, in some implementations, contain a silicon carbide (SiC) material, a silicon nitride (SiN) material, a silicon carbonitride (SiCN) material, or a combination thereof. Silicon-carbon-oxides and silicon-carbon-oxynitrides, and silicon-carbon-nitrides may also be formed in some implementation ALD-formed films. Methods, techniques, and operations for depositing these types of films are described in detail in U.S. patent application Ser. No. 13/494,836, filed Jun. 12, 2012, titled "REMOTE PLASMA BASED DEPOSITION OF SiOC CLASS OF FILMS,"; U.S. patent application Ser. No. 13/907,699, filed May 31, 2013, titled "METHOD TO OBTAIN SiC CLASS OF FILMS OF DESIRED COMPOSITION AND FILM PROPERTIES,"; U.S. patent application Ser. No. 14/062,648, titled "GROUND STATE HYDROGEN RADICAL SOURCES FOR CHEMICAL VAPOR DEPOSITION OF SILICON-CARBON-CONTAINING FILMS"; and U.S. patent application Ser. No. 14/194,549, filed Feb. 28, 2014, and titled "CAPPED ALD FILMS FOR DOPING FIN-SHAPED CHANNEL REGIONS OF 3-D IC TRANSISTORS"; each of which is hereby incorporated by reference in its entirety and for all purposes.

Other examples of film deposition via ALD include chemistries for depositing dopant-containing films as described in the patent applications listed and incorporated by reference above (U.S. patent application Ser. Nos. 13/084,399, 13/242,084, 13/224,240, and 14/194,549). As described therein, various dopant-containing film precursors may be used for forming the dopant-containing films, such as films of boron-doped silicate glass (BSG), phosphorous-doped silicate glass (PSG), boron phosphorus doped silicate glass (BPSG), arsenic (As) doped silicate glass (ASG), and the like. The dopant-containing films may include $B_2O_3$, $B_2O$, $P_2O_5$, $P_2O_3$, $As_2O_3$, $As_2O_5$, and the like. Thus, dopant-containing films having dopants other than boron are feasible. Examples include gallium, phosphorous, or arsenic dopants, or other elements appropriate for doping a semiconductor substrate, such as other valence III and V elements.

As for ALD process conditions, ALD processes may be performed at various temperatures. In some implementations, suitable temperatures within an ALD reaction chamber may range from between about 25° C. and 450° C., or between about 50° C. and 300° C., or between about 20° C. and 400° C., or between about 200° C. and 400° C., or between about 100° C. and 350° C.

Likewise, ALD processes may be performed at various ALD reaction chamber pressures. In some implementations, suitable pressures within the reaction chamber may range from between about 10 mTorr and 10 Torr, or between about 20 mTorr and 8 Torr, or between about 50 mTorr and 5 Torr, or between about 100 mTorr and 2 Torr.

Various RF power levels may be employed to generate a plasma if used in operation (iii). In some implementations, suitable RF power may range from between about 100 W and 10 kW, or between about 200 W and 6 kW, or between about 500 W, and 3 kW, or between about 1 kW and 2 kW.

Various film precursor flow rates may be employed in operation (i). In some implementations, suitable flow rates may range from about or between 0.1 mL/min to 10 mL/min, or about or between 0.5 mL/min and 5 mL/min, or about or between 1 mL/min and 3 mL/min.

Various gas flow rates may be used in the various operations. In some implementations, general gas flow rates may range from about or between 1 L/min and 20 L/min, or about or between 2 L/min and 10 L/min. For the optional inert purge steps in operations (ii) and (iv), an employed burst flow rate may range from about or between 20 L/min and 100 L/min, or about or between 40 L/min and 60 L/min.

Once again, in some implementations, a pump-to-base step refers to pumping the reaction chamber to a base pressure by directly exposing it to one or more vacuum pumps. In some implementations, the base pressure may typically be only a few milliTorr (e.g., between about 1 and 20 mTorr). Furthermore, as indicated above, a pump-to-base step may or may not be accompanied by an inert purge, and thus carrier gases may or may not be flowing when one or more valves open up the conductance path to the vacuum pump.

Also, once again, multiple ALD cycles may be repeated to build up stacks of conformal layers. In some implementations, each layer may have substantially the same composition whereas in other implementations, sequentially ALD deposited layers may have differing compositions, or in certain such implementations, the composition may alternate from layer to layer or there may be a repeating sequence of layers having different compositions, as described above. Thus, depending on the implementation, certain stack engineering concepts, such as those disclosed in the patent applications listed and incorporated by reference above (U.S. patent application Ser. Nos. 13/084,399, 13/242,084, and 13/224,240) may be used to modulate boron, phosphorus, or arsenic concentration in these films.

Figure 3:
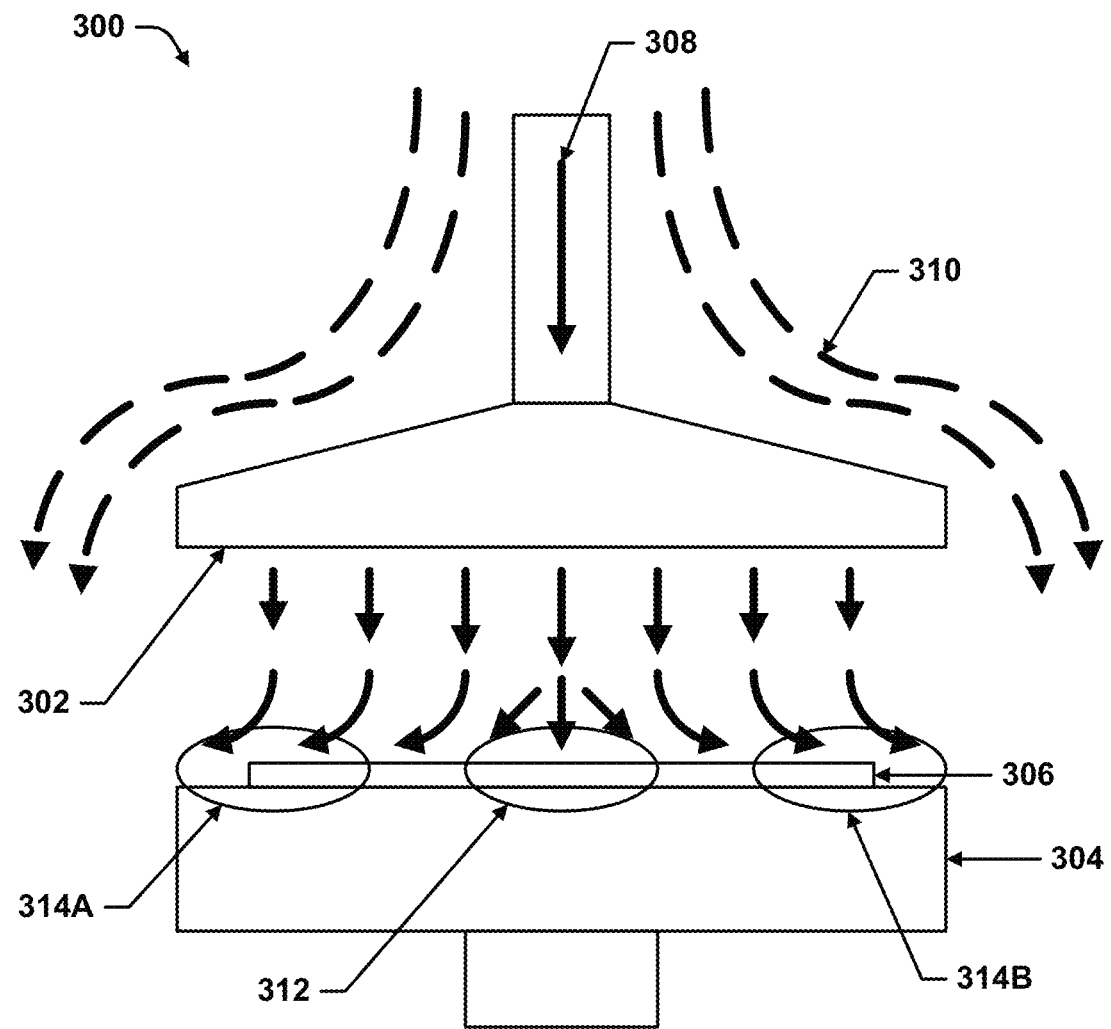
FIG. 3 is a schematic of a substrate process station illustrating precursor flow within a processing chamber during a deposition process.

FIG. 3 is a schematic of a substrate process station illustrating precursor flow within a processing chamber during a deposition process. The substrate process station 300 includes a showerhead 302 and a pedestal 304 supporting a substrate 306.

Process gas 308 is delivered to the substrate 306 via the showerhead 302. In certain implementations, the process gas 308 may be a precursor or a combination of precursor and carrier gas. The substrate may adsorb the precursor and form an adsorption layer on the substrate 306. During certain phases of a deposition cycle, a purge gas or other process gases may flow via the showerhead 302 instead of the process gas 308.

Additionally, in FIG. 3, a purge gas 310 flows along the exterior of the showerhead 302. In certain implementations, the purge gas 310 may prevent deposition on the backside of the showerhead 302.

Figure 9A:
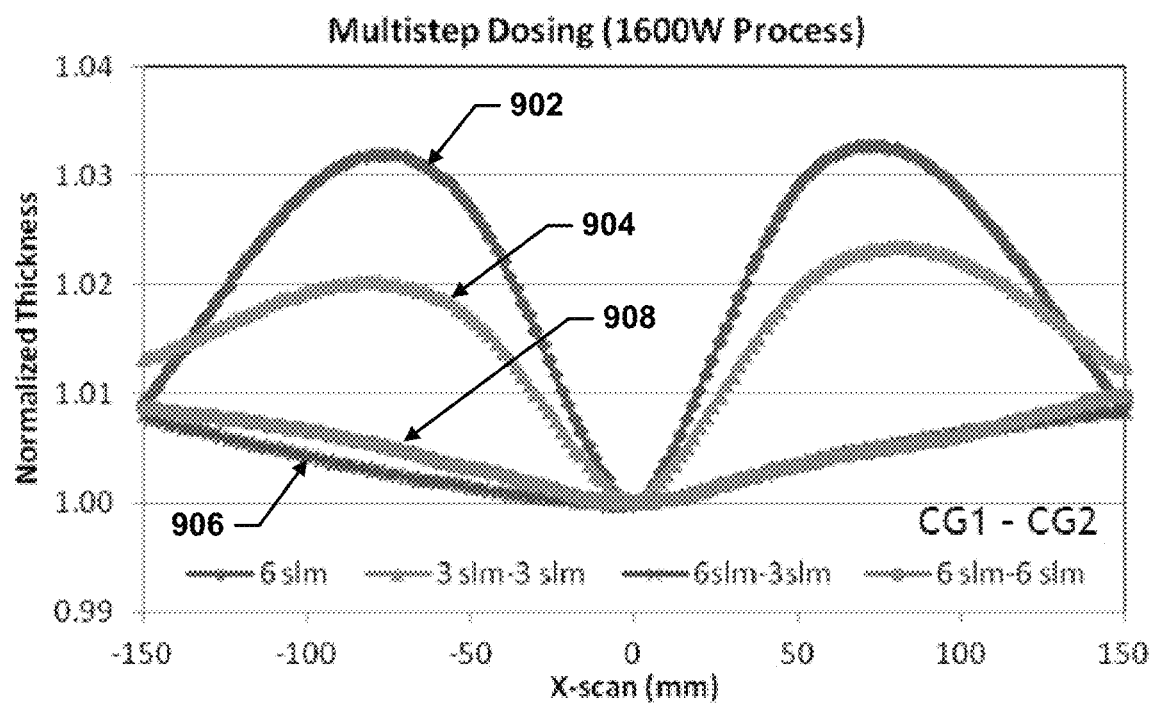
FIG. 9A is a chart showing various wafer uniformity of example wafers processed using various precursor delivery configurations.
Figure 9B:
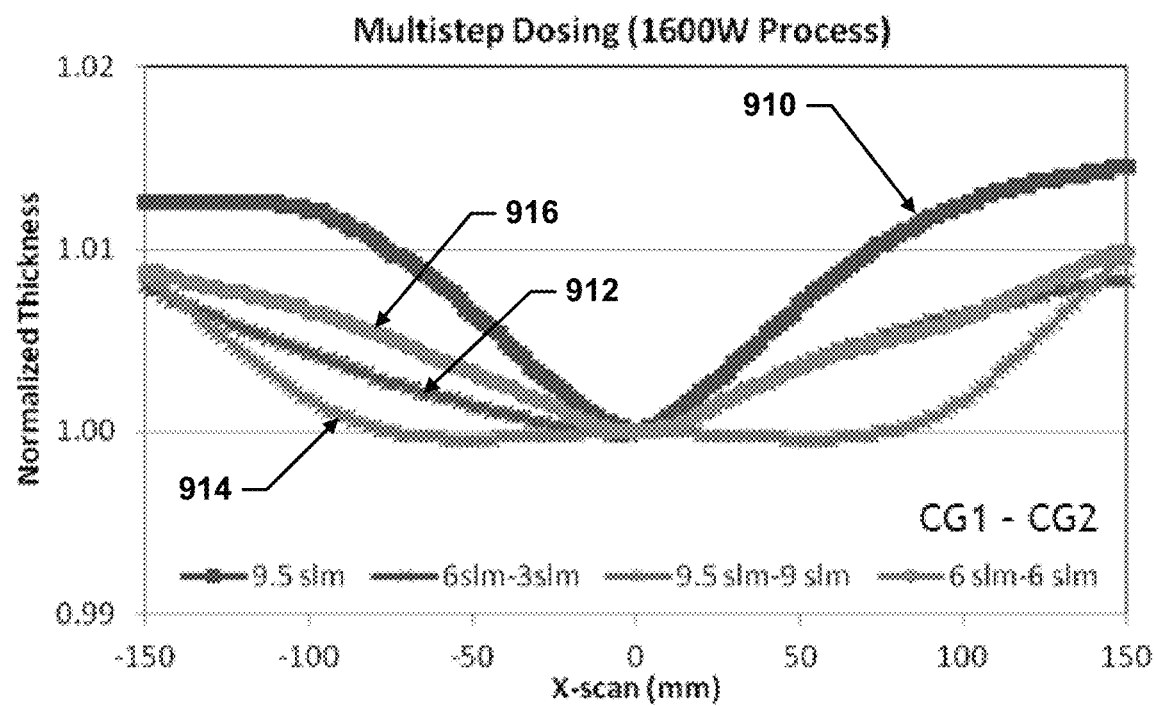
FIG. 9B is an additional chart showing various wafer uniformity of example wafers processed using various precursor delivery configurations.
Figure 9C:
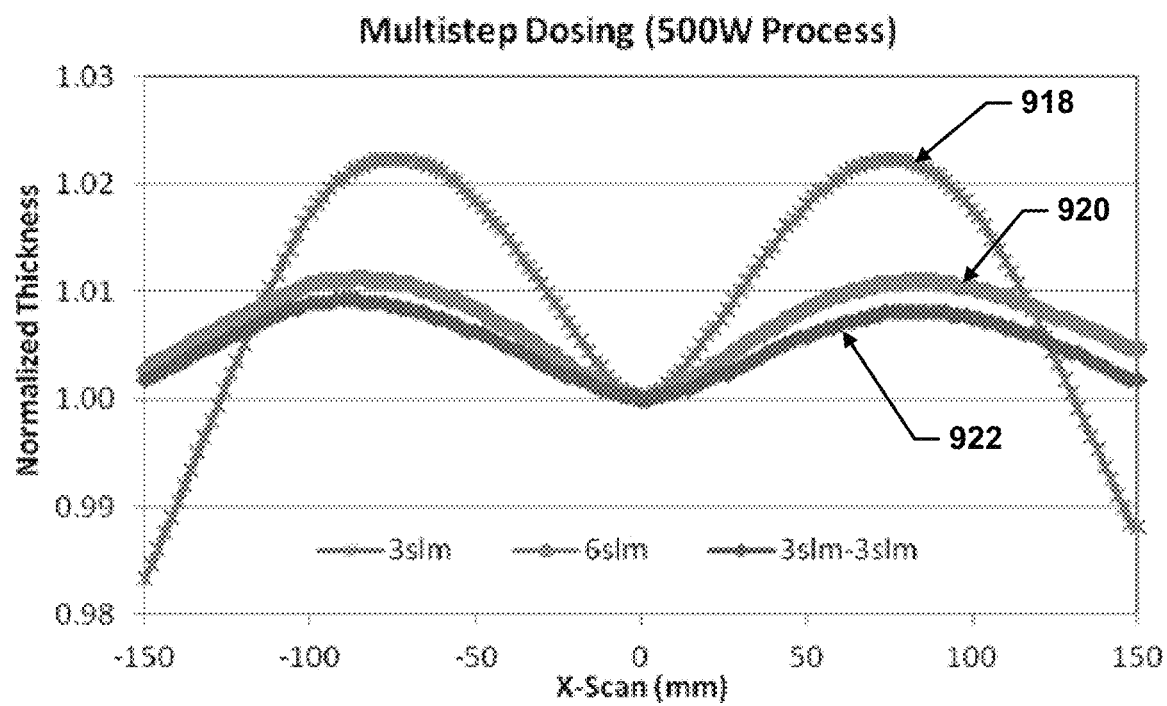
FIG. 9C is another chart showing various wafer uniformity of example wafers processed using various precursor delivery configurations.

The flow of the process gas 308 and the purge gas 310 around the interior of the substrate process station 300 may result in uneven dosing of the substrate 306. Uneven dosing may result in non-uniform processed substrates. In certain implementations, the flow of the process gas 308 over the surface of the substrate 306 may result in uneven dosing of area 312 on the surface of the substrate 306. Additionally, the flow of purge gas 310 may result in uneven dosing of areas 314A and 314B on the surface of the substrate 306. The results of uneven dosing in some implementations are illustrated in FIGS. 9A-C.

Figure 4:
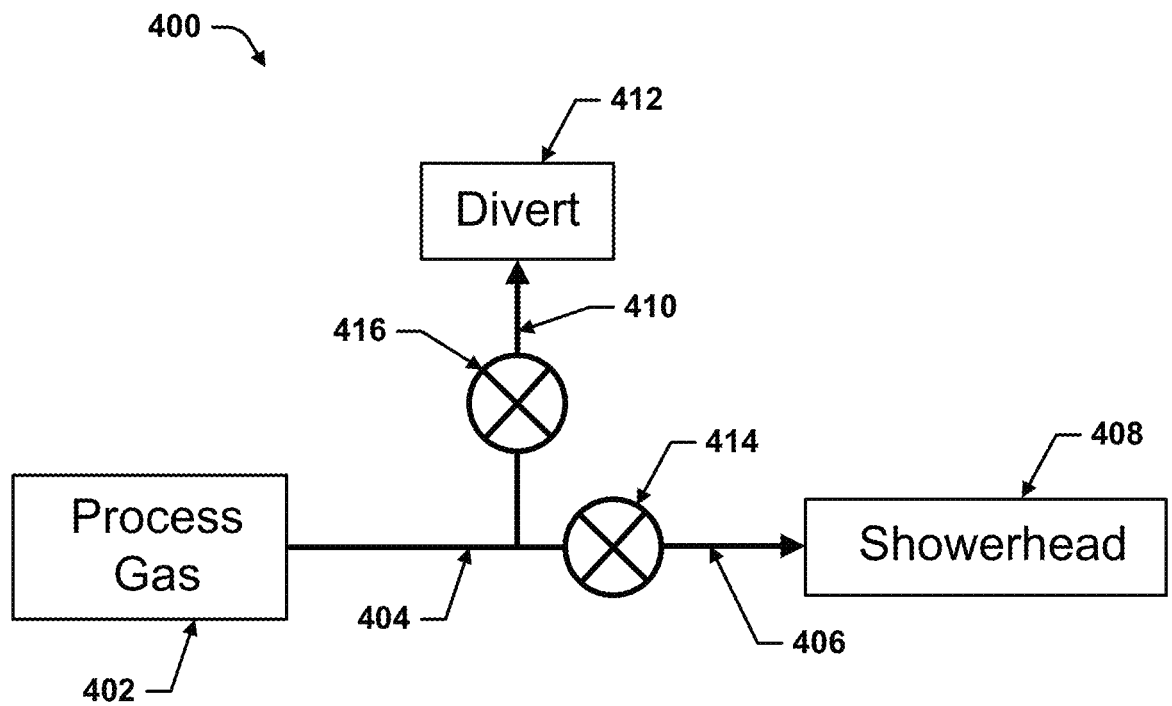
FIG. 4 is a schematic representation of a typical precursor delivery system for a substrate process station.

The process gas 308 in FIG. 3 may be delivered through a process gas delivery system in a substrate processing apparatus. A process gas delivery system may include a configuration of flow paths and valves. Valves which may be used in precursor gas delivery systems include pneumatically and electrically actuated diaphragm-sealed or bellow-sealed valves and valve manifolds such as ALD valves, DP series valves from Swagelok, and MEGA series, Standard series and electrically controlled valves from Fujikin. FIG. 4 is a schematic representation of a typical precursor delivery system for a substrate process station.

FIG. 4 shows a precursor delivery system 400. In FIG. 4, a process gas source 402 is connected to a flow path 404. The first flow path 404 is connected to two additional flow paths; showerhead flow path 406 and divert flow path 410. The showerhead flow path 406 leads to the showerhead 408. The divert flow path 410 leads to a divert dump 412.

The showerhead 408 may introduce process gas into a substrate processing chamber such that a substrate within a substrate processing chamber will be dosed with precursor from the process gas. In certain implementations, the showerhead may be replaced with another technique for delivering process gas. In certain implementations, during substrate processing, process gas may continuously flow through the first flow path 404. In such implementations, the process gas may flow to the divert dump 412 when the showerhead 408 is not ready to receive process gas.

In certain implementations, the flow of process gas from the first flow path 404 into the showerhead flow path 406 is controlled by the showerhead valve 414. The flow of process gas from the first flow path 404 into the divert flow path 410 is controlled by the divert valve 416. In such implementations, only one of the showerhead valve 414 and the divert valve 416 may be open at any one time. In certain implementation, there may be an overlap between valves 414 and 416 during open-close operation where both valves are in open state for a short period of time before the closing of either valves 414 or 416. In certain other implementations, control of the flow of process gas into either the showerhead flow path 406 or the divert valve 416 may be controlled by a single valve or multiple valves. In configurations with a single valve, the single valve may alternatively allow process gas to flow into one of either the showerhead flow path 406 or the divert valve 416.

Figure 5A:
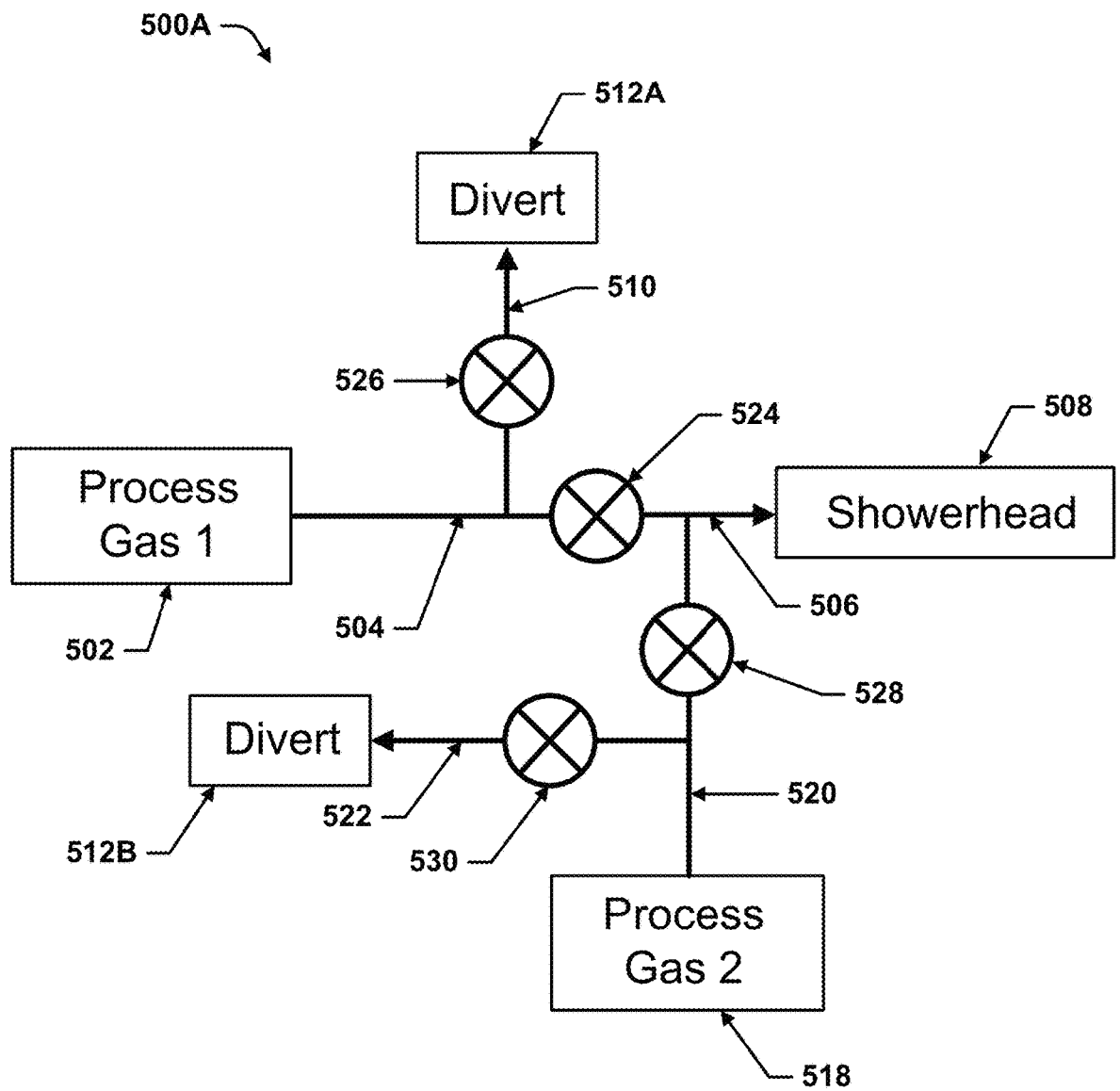
FIG. 5A is a schematic representation of a configuration of a multi-step precursor delivery system for a substrate process station.

The present inventors have conceived of improvements to the precursor delivery system illustrated in FIG. 4 to improve uniformity of processed substrates. Such improved precursor delivery systems, which may be referred to as multi-step precursor delivery systems, may be implemented with both vapor-based delivery systems and liquid delivery systems. Vapor-based delivery systems may use an ampoule to evaporate precursor. Liquid delivery systems may use a vaporizer to evaporate precursor. FIG. 5A is a schematic representation of a configuration of a multi-step precursor delivery system for a substrate process station.

The multi-step precursor delivery system 500A in FIG. 5A includes a first process gas source 502 connected to a first flow path 504 and a second process gas source 518 connected to a second flow path 520. In certain implementations, the first process gas from the first process gas source 502 may be a process gas which includes precursor and/or carrier gas. Additionally, the second process gas from the second process gas source 518 may be a process gas which includes precursor and/or carrier gas. The precursor and/or carrier gas used for the first and second process gases may be similar or different. The carrier gas may be a gas such as argon, nitrogen (N2), oxygen (O2), nitrous oxide (N2O), helium, other inert gases or a mixture of these gases. In certain other implementations, a carrier gas source may be shared between the first flow path and the second flow path, with a further precursor source connected to the first flow path and/or the second flow path. In such implementations, the carrier gas and the precursor may be mixed at some point before entering the showerhead. In certain implementations, single valves in the figures described herein may be replaced with multiple valves.

The first flow path 504 is fluidically connected to the showerhead flow path 506 and a first divert flow path 510. The showerhead flow path 506 leads to a showerhead 508 while the first divert flow path 510 leads to the first divert dump 512A. The flow of process gas from the first flow path 504 into the showerhead flow path 506 is controlled by a first showerhead valve 524. The flow of process gas from the first flow path 504 into the first divert flow path 510 is controlled by a first divert valve 526. In certain implementations, only one of the first showerhead valve 524 and the first divert valve 526 may be open at any one time. Additionally, in certain implementations, the first flow path may be directly connected to the showerhead, possibly with a first showerhead valve controlling the flow of process gas between the first flow path and the first showerhead. In such implementations, there may not be a first showerhead flow path.

The second flow path 520 is fluidically connected to the showerhead flow path 506 and a second divert flow path 522. The second divert flow path 522 leads to the second divert dump 512B. The flow of process gas from the second flow path 520 into the showerhead flow path 506 is controlled by a second showerhead valve 528. Flow from the second flow path 520 into the second divert flow path 522 is controlled by a second divert valve 530. In certain implementations, only one of the second showerhead valve 528 and the second divert valve 530 may be open at any one time.

Figure 10A:
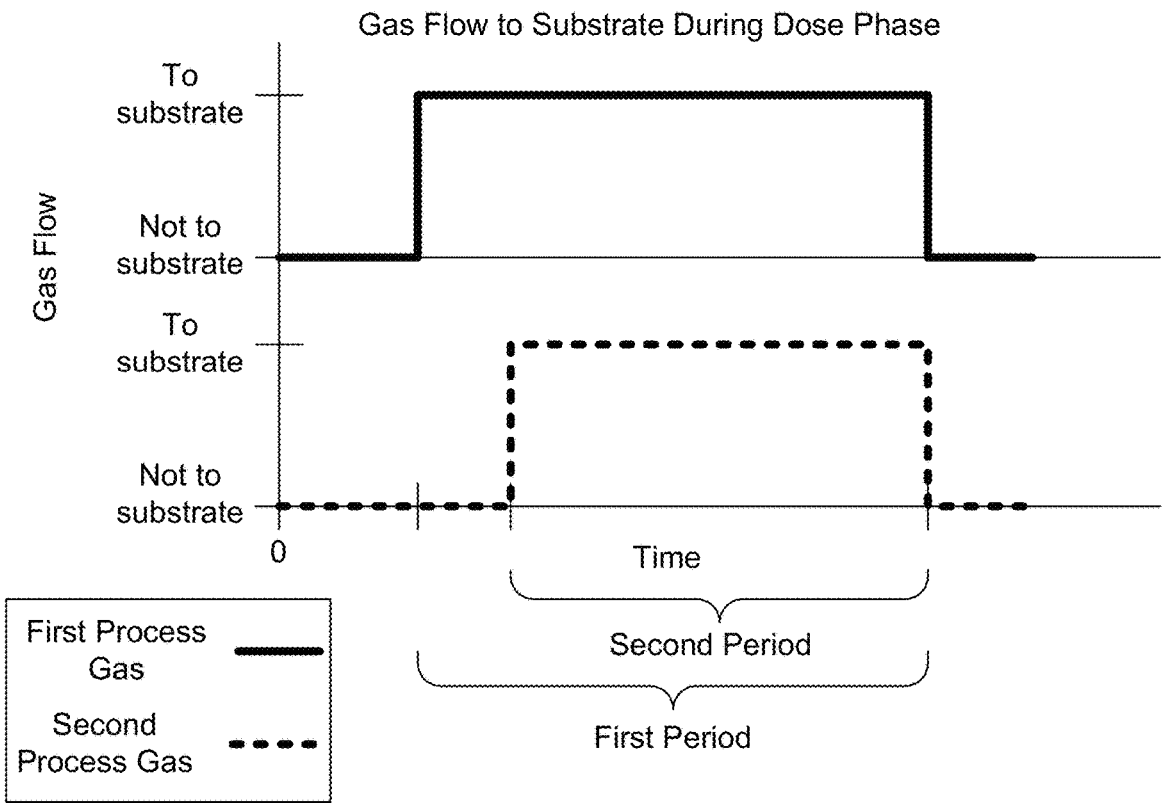
FIG. 10A is a chart showing gas flow to a substrate in a processing chamber during a dose phase of an ALD deposition cycle using a multi-step precursor delivery system during deposition processes.
Figure 10B:
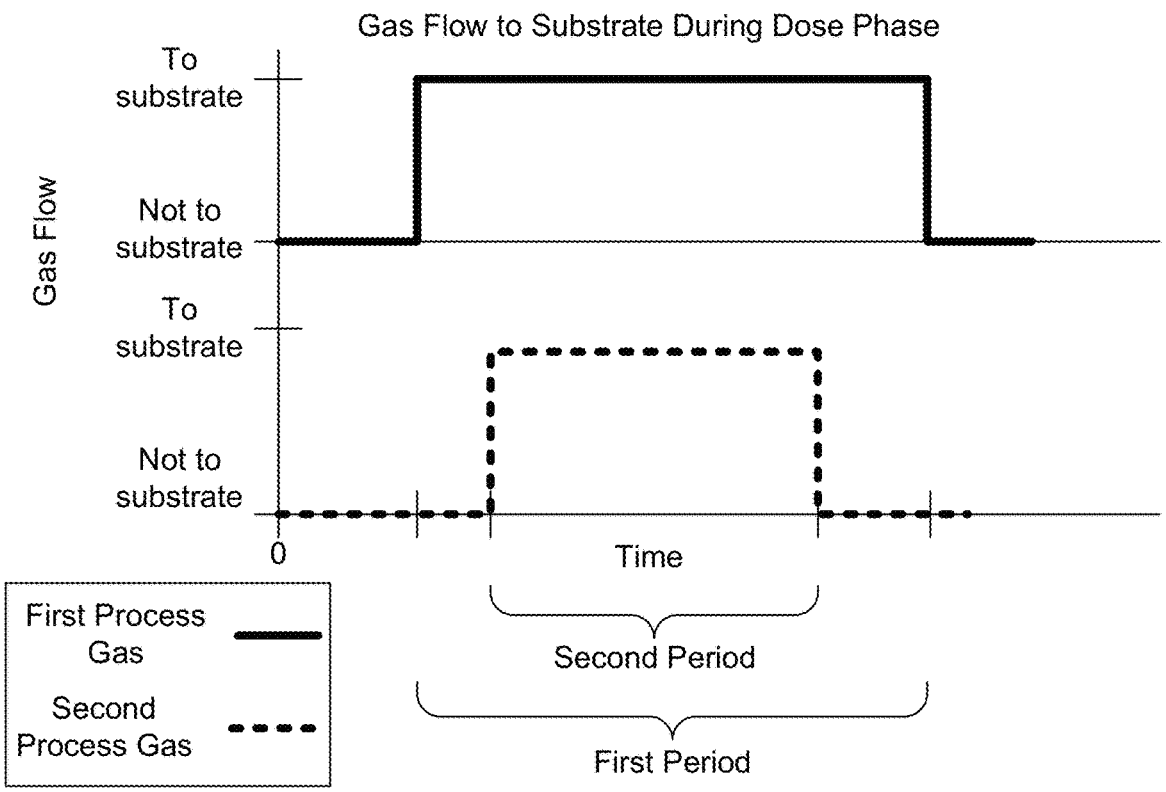
FIG. 10B is another chart showing gas flow to a substrate in a processing chamber during a dose phase of an ALD deposition cycle using a multi-step precursor delivery system during deposition processes.
Figure 10C:
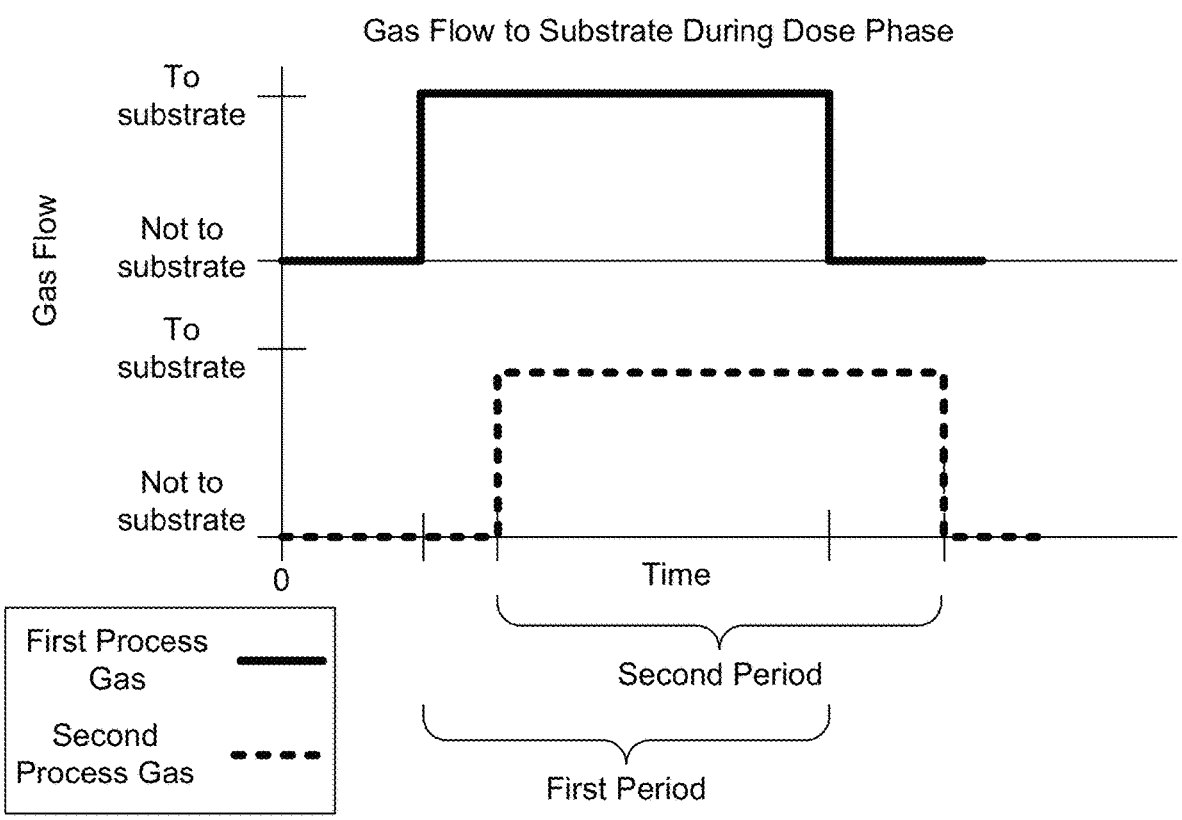
FIG. 10C is yet another chart showing gas flow to a substrate in a processing chamber during a dose phase of an ALD deposition cycle using a multi-step precursor delivery system during deposition processes.

In certain implementations, the multi-step precursor delivery system 500A may be controlled by a controller as described elsewhere in this disclosure. In certain implementations, the multi-step precursor delivery system 500A first delivers process gas from the first process gas source 502 to the showerhead 508 before delivering process gas from the second process gas source 518 to the showerhead 508 at a later time period. The delivery periods of the first process gas and second process gas may overlap. The timing of the delivery periods of the first process gas and the second process gas is described in greater detail elsewhere in this disclosure. See also, for example, FIGS. 10A-10C.

Figure 5B:
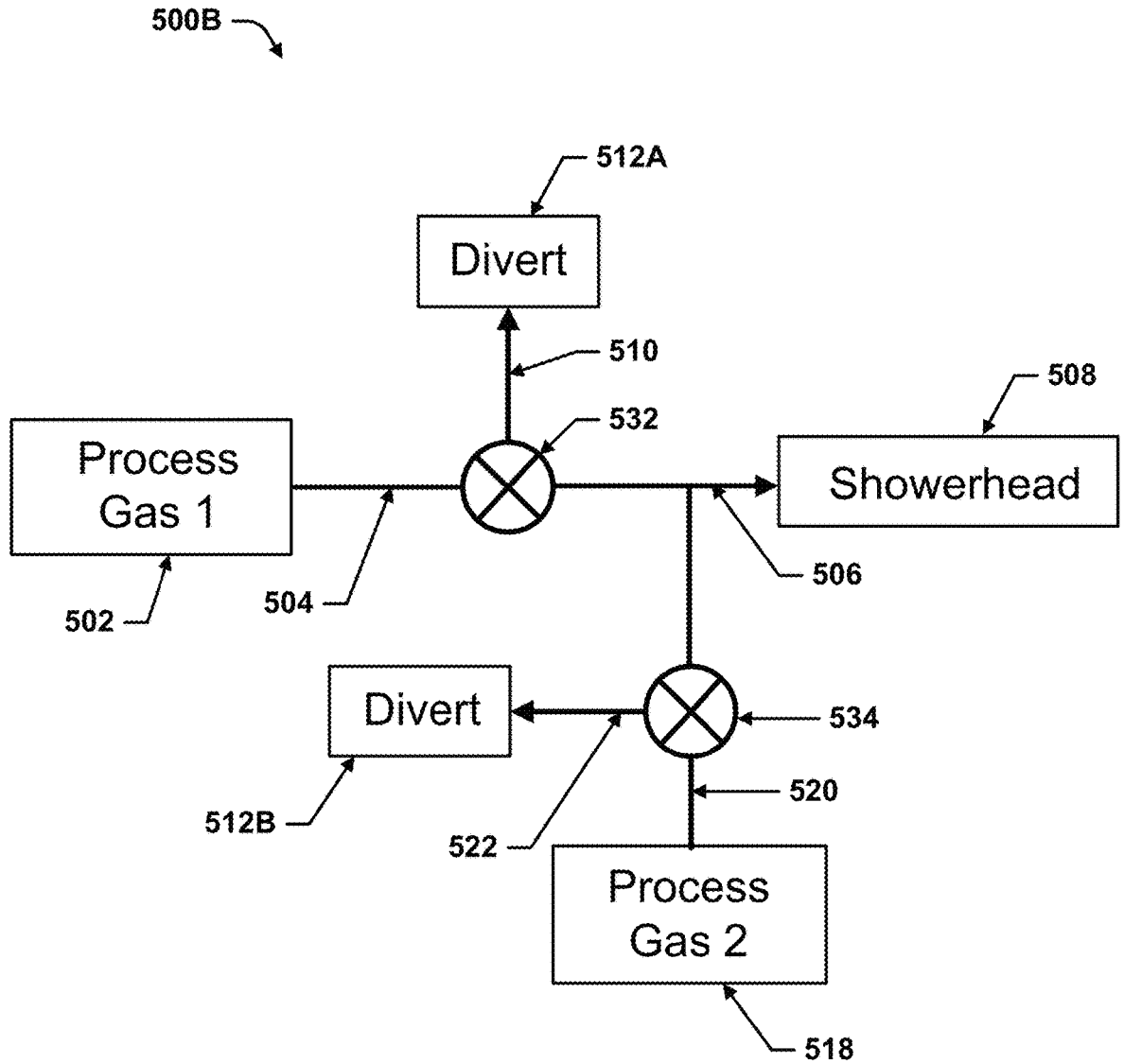
FIG. 5B is a schematic representation of another configuration of a multi-step precursor delivery system for a substrate process station.

FIG. 5B is a schematic representation of another configuration of a multi-step precursor delivery system for a substrate process station. The multi-step precursor delivery system 500B is similar in configuration to the delivery system 500A. In the multi-step precursor delivery system 500B the first showerhead valve 524 and the first divert valve 526 is replaced with a first flow path valve 532. In certain implementations, the first flow path valve 532 may be configured to alternatively direct process gas flow from the first flow path 504 towards either the showerhead flow path 506 or the first divert flow path 510.

Additionally, the second showerhead valve 528 and second divert valve 530 of the delivery system 500A in FIG. 5A has been replaced with a second flow path valve 534 in the multi-step precursor delivery system 500B in FIG. 5B. The second flow path valve 534 may be similar in configuration to the first flow path valve 532. In certain implementations, the second flow path valve 534 may alternatively direct process gas flow from the second flow path 520 towards either the showerhead flow path 506 or the second divert flow path 522.

Figure 5C:
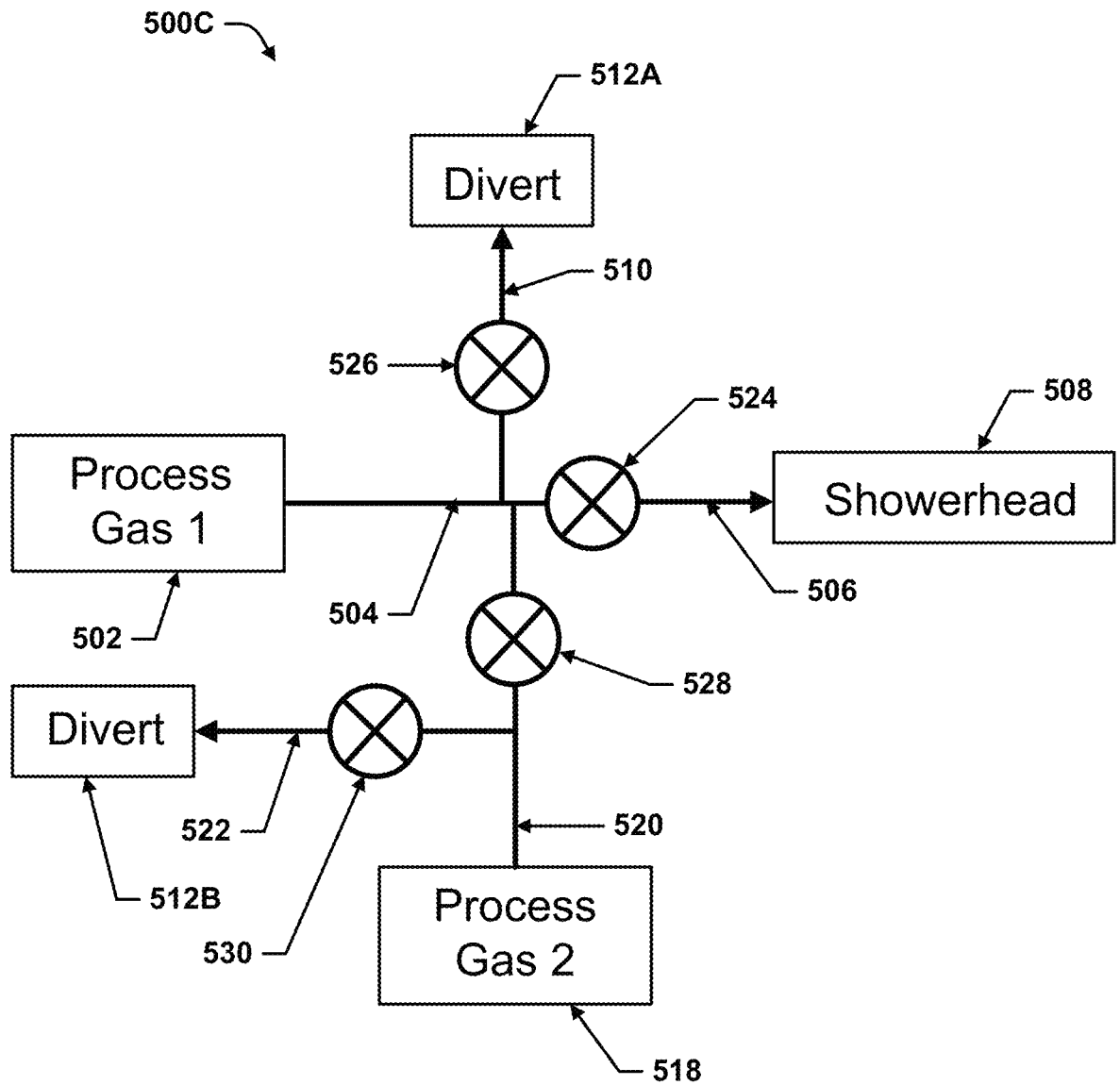
FIG. 5C is a schematic representation of an additional alternative configuration of a multi-step precursor delivery system for a substrate process station.

FIG. 5C is a schematic representation of an additional alternative configuration of a multi-step precursor delivery system for a substrate process station. The multi-step precursor delivery system 500C is similar in configuration to the delivery system 500A. In the multi-step precursor delivery system 500C, the second flow path 520 terminates into a portion of the first flow path 504. Thus, the first showerhead valve 524 may control the flow of both the first process gas and the first process gas to the showerhead 508. Such a configuration may be used when the first and second process gases are timed to cease flowing to the showerhead at the same time. In such cases, the first showerhead valve 524 may simultaneously shut off the flow of both process gases.

Figure 6A:
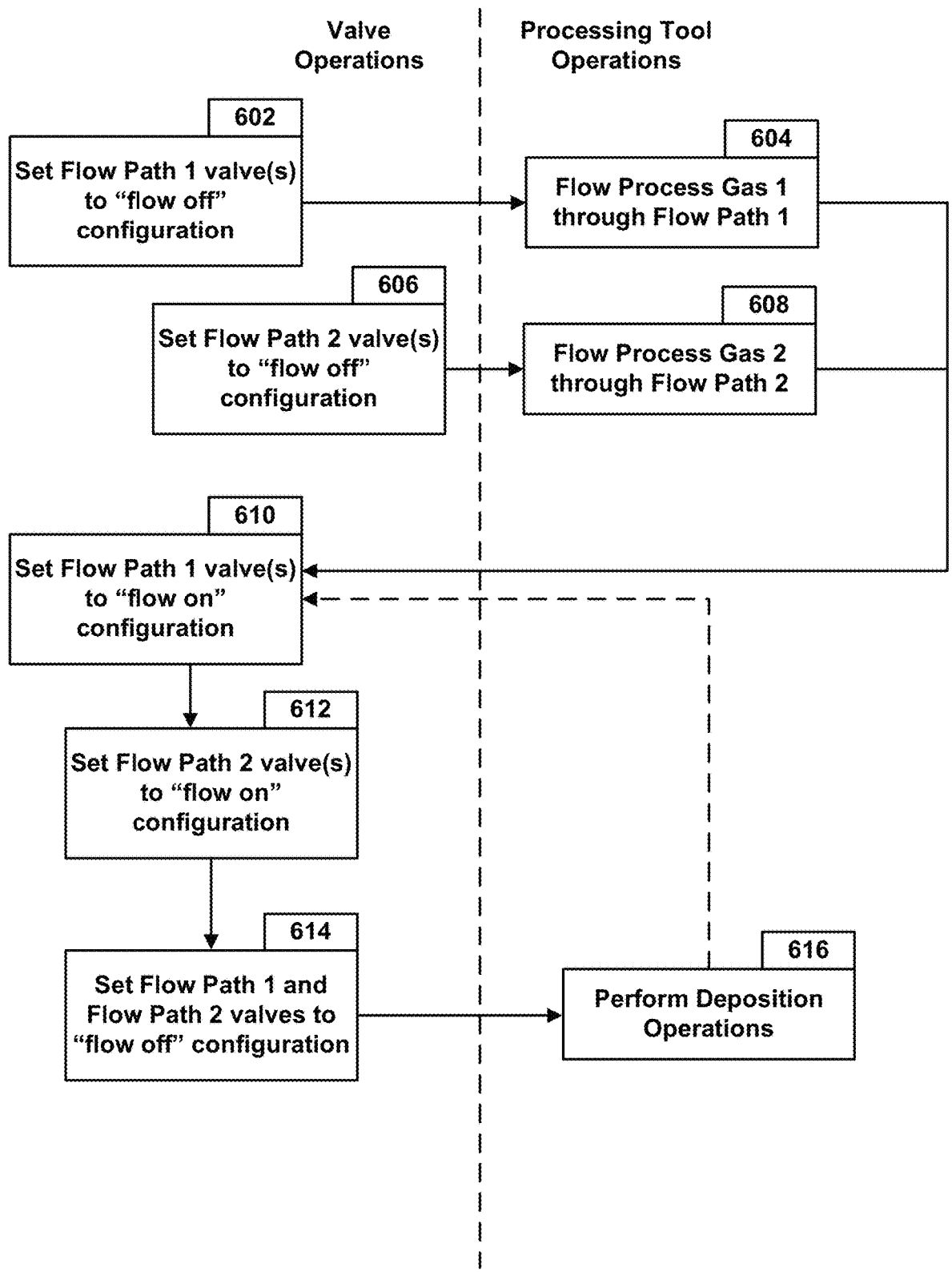
FIG. 6A is a flowchart of an example sequence of operations of a deposition process using a multi-step precursor delivery system.

The multi-step precursor delivery system allows for the delivery of a second process gas to complement the delivery of a first process gas. The present inventors have realized that adding an additional second process gas to the delivery of the process gas may result in improvements in the uniformity of processed substrates. FIG. 6A is a flowchart of an example sequence of operations of a deposition process using an multi-step precursor delivery system. The example sequence illustrated in FIG. 6A may result in improved uniformity of processed substrates and may be performed with any of the multi-step precursor delivery systems of FIGS. 5A-C as part of a substrate processing apparatus. Portions of the sequence outlined in FIG. 6A will be illustrated with examples that refer to the multi-step precursor delivery system 500A in FIG. 5A.

In certain implementations, the flow of the first and/or second process gas from the process gas sources may be controlled by a mass flow controller (MFC). The MFC in certain implementations may have a lead time when changing the volume of flow of process gas. In such implementations, the precursor delivery system may allow the process gas or gases to flow continuously during substrate processing and to control whether the process gas or gases flow into the showerhead through the actuation of the valves within the flow paths.

In block 602, a valve or multiple valves fluidically connected to a first flow path, such as the first flow path 504 of FIG. 5A, and designed to regulate flow from the first flow path to a showerhead, is set to a "flow off" configuration. A "flow off" configuration may be a configuration of the valve(s) that prevents process gas from reaching the showerhead. To use the example of the multi-step precursor delivery system 500A in FIG. 5A, a "flow off" configuration of the valves may have the first showerhead valve 524 in a closed configuration, thus preventing the first process gas from the first process gas source 502 from flowing into the showerhead 508. In certain implementations, the first divert valve 526, or other valves that may direct the process gas to a divert dump or vacuum, may allow the first process gas to be diverted to a dump or vacuum when the first process gas is prevented from reaching the showerhead 508. Such a configuration would allow the first process gas to continue to flow, charging the first flow path 504 with process gas while the first showerhead valve 524 is closed.

In block 604, the first process gas flows from a first process gas source, such as the first process gas source 502 of FIG. 5A, through the first flow path. In block 604, the first flow path valve(s) are still in a "flow off" configuration designed to prevent the first process gas from reaching the showerhead.

In block 606, a valve or multiple valves fluidically connected to a second flow path, such as the second flow path 520 of FIG. 5A, and designed to regulate flow from the second flow path to the showerhead, is set to a "flow off" configuration similar to the "flow off" configuration described for block 602. In block 608, the second process gas then flows from a second process gas source, such as the second process gas source 518 of FIG. 5A, through the second flow path. In block 608, the second flow path valve(s) are still in a "flow off" configuration designed to prevent the second process gas from reaching the showerhead.

Proceeding to block 610, the valve(s) described in block 602 may be set to a "flow on" configuration. A "flow on" configuration may be a configuration of the valve(s) that allows process gas to reach the showerhead. The showerhead may then distribute the process gas to a substrate processing chamber. Returning to the example of the multi-step precursor delivery system 500A in FIG. 5A, a "flow on" configuration of the valves may have the first showerhead valve 524 in an open configuration to allow the first process gas from the first process gas source 502 to flow into the showerhead 508. The first divert valve 526 in such a configuration may be in a closed configuration to prevent the first process gas flowing through the first flow path from reaching the divert dump or vacuum and, thus, allowing all of the first process gas provided by the first process gas source to reach the showerhead.

In block 612, occurring after block 610, the valve(s) described in block 606 may be set to a "flow on" configuration. The "flow on" configuration in block 612 may be similar to the "flow on" configuration described in block 610. When the valve(s) in block 612 are set to the "flow on" configuration, the second process gas may then flow into the showerhead. The volumetric flow of total process goals through the showerhead in block 612, when both the first and second process gases are flowing through the showerhead, may be higher than the volumetric flow in block 610, when only the first process gas is flowing through the showerhead. In certain implementations, the second process gas may be a carrier gas. In such implementations, introduction of the flow of the second process gas into the showerhead may result in improved uniformity of processed substrates.

After both the first and second process gases are flowing into the showerhead in blocks 610 and 612, the valve(s) of flow paths 1 and 2 described in blocks 602 and 606 may be returned to a "flow off" configuration. Accordingly, after the valve(s) have been returned to the "flow off" configuration, the first and second process gases may not flow into the showerhead. Blocks 610 and 612 may occur during a dose phase of a deposition cycle. Block 614 may occur around the end of the dose phase of the deposition cycle.

After the valves in block 614 have been set to a "flow off" configuration, the rest of the deposition cycle may be performed. After the rest of the deposition cycle has been performed, the sequence may then return to block 610 to perform another dosing phase for another deposition cycle. Multiple deposition cycles may be performed until the desired number of deposition cycles have been performed to process the substrate.

Figure 6B:
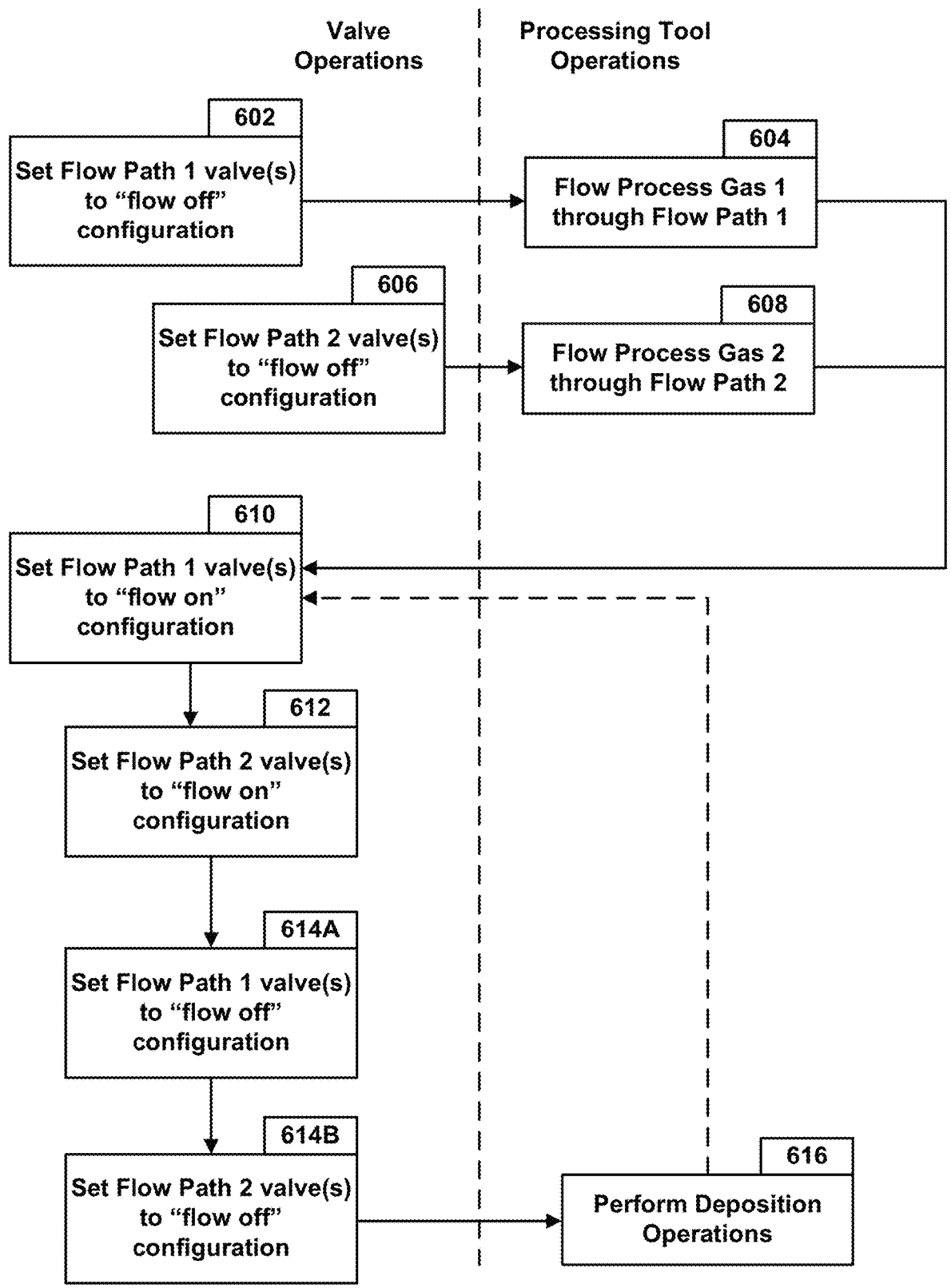
FIG. 6B is a flowchart of another example sequence of operations of a deposition process using a multi-step precursor delivery system.

FIG. 6B is a flowchart of another example sequence of operations of a deposition process using a multi-step precursor delivery system. The sequence illustrated in FIG. 6B is similar to the sequence illustrated in FIG. 6A. However, while FIG. 6A returns both the valves regulating the flow of process gases from the first flow path and the second flow path into the showerhead to a "flow off" configuration at around the same time, see, for example, FIG. 10A, the sequence illustrated in FIG. 6B returns the valve(s) controlling the flow of the first process gas from the first flow path to the showerhead to a "flow off" configuration at a first time period, as shown in block 614A. After the first time period, the valve(s) controlling the flow of the second process gas from the second flow path to the showerhead is then returned to a "flow off" configuration in block 614B. See, for example, FIG. 10C.

In the sequence illustrated in FIG. 6B, the second process gas may continue to flow through the showerhead after the first process gas ceases flowing through the showerhead. See again, for example, FIG. 10C. Such a sequence may allow for the second process gas, which may be a carrier gas without precursor, to purge the flow paths within the showerhead after precursor has flowed through the showerhead flow paths. Continuing to flow the second process gas after the flow of the first process gas has finished may also, in some implementations, increase the uniformity of processed substrates.

Figure 6C:
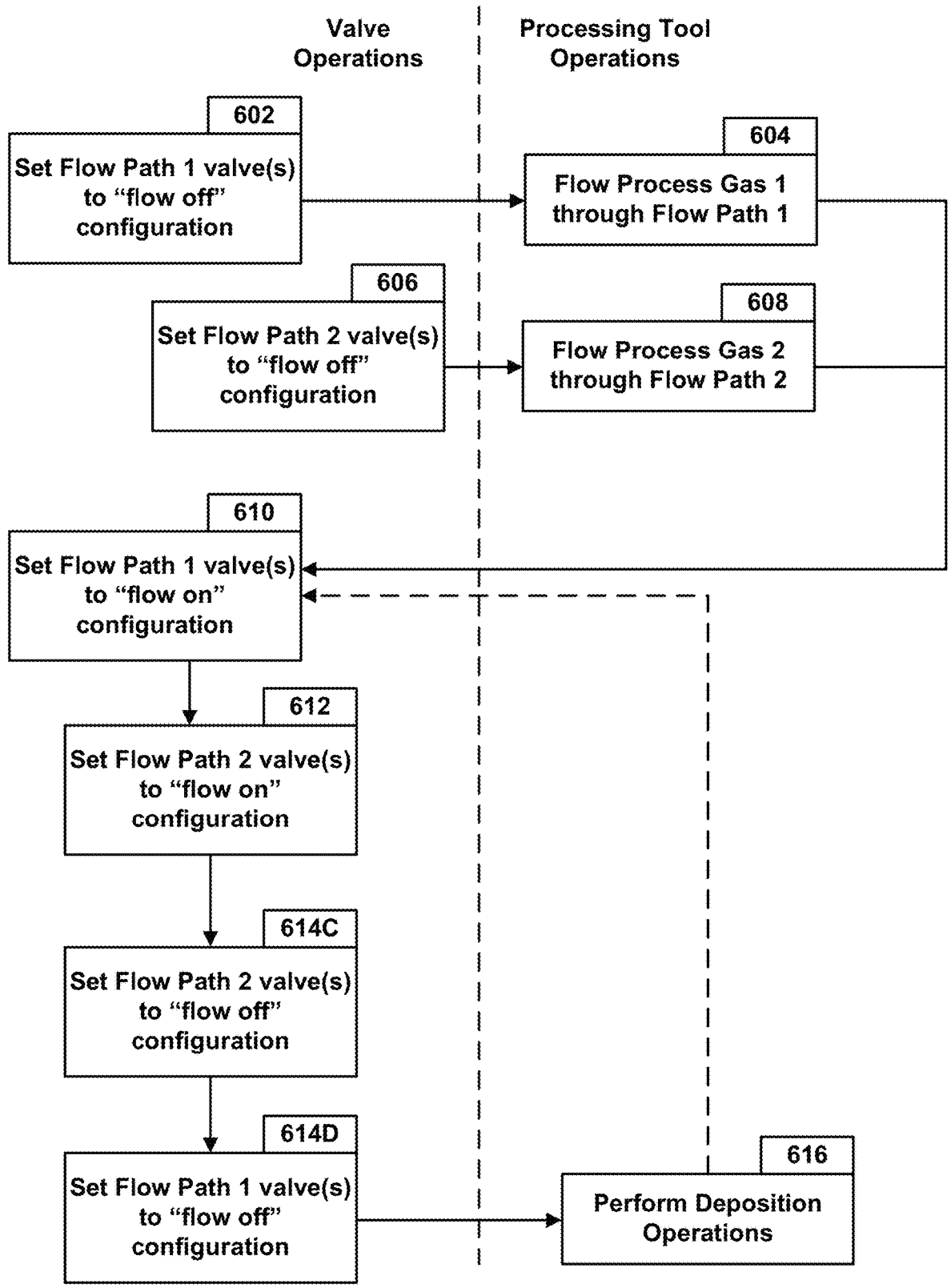
FIG. 6C is a flowchart of an additional example sequence of operations of a deposition process using a multi-step precursor delivery system.

FIG. 6C is a flowchart of an additional example sequence of operations of a deposition process using a multi-step precursor delivery system. The sequence illustrated in FIG. 6C is similar to the sequence illustrated in FIG. 6A. However, while FIG. 6A returns both the valves regulating the flow of process gases from the first flow path and the second flow path into the showerhead to a "flow off" configuration at around the same time, the sequence illustrated in FIG. 6C returns the valve(s) controlling the flow of the second process gas from the second flow path to the showerhead to a "flow off" configuration at a first time period, as shown in block 614C. After the first time period, the valve(s) controlling the flow of the first process gas from the first flow path to the showerhead is then returned to a "flow off" configuration in block 614D. In certain implementations, continuing to flow the first process gas after the second process gas has stopped flowing may increase the uniformity of processed substrates. See, for example, FIG. 10B.

Figure 7A:
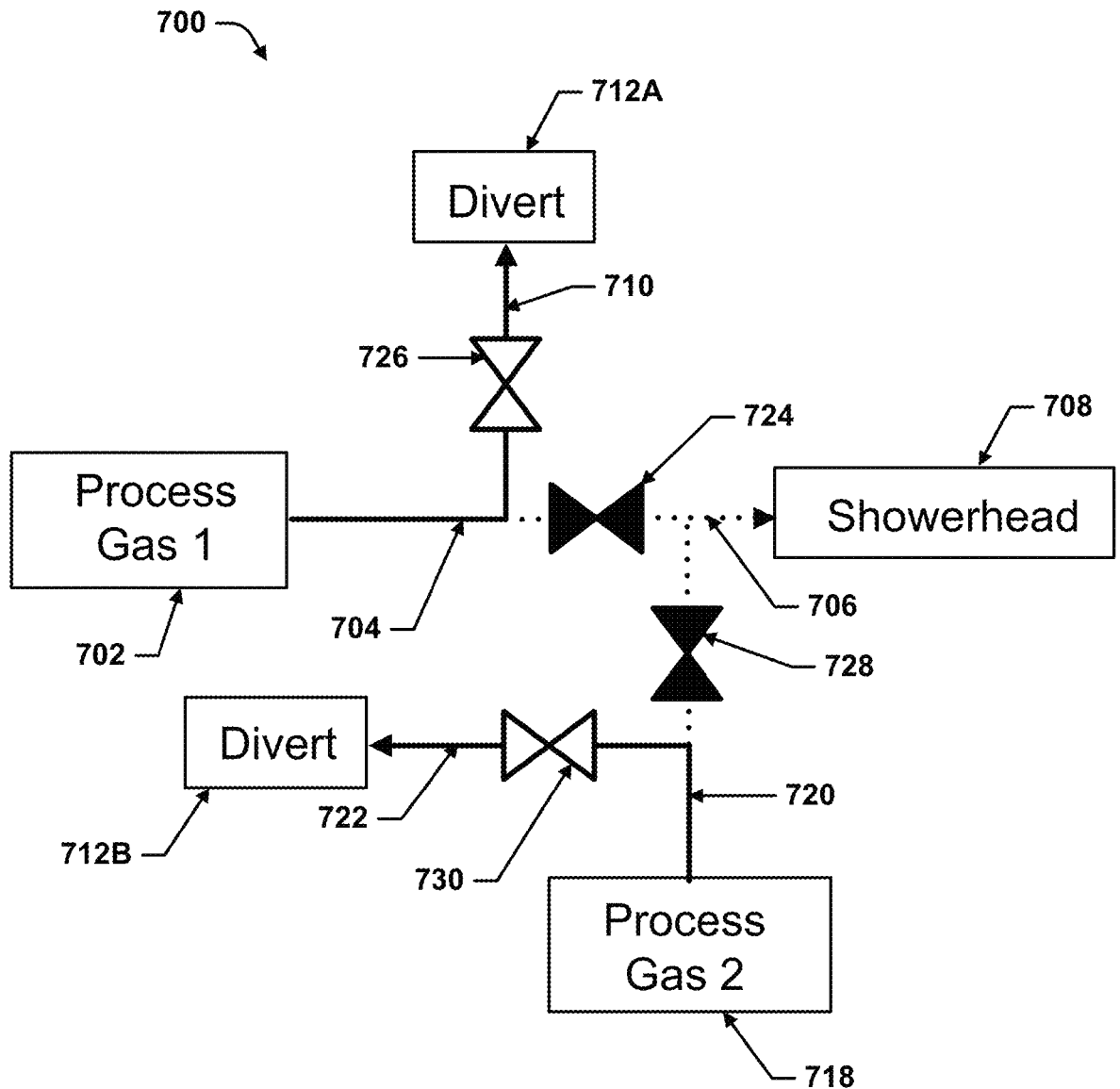
FIG. 7A shows a step in a sequence of precursor delivery operations using the multi-step precursor delivery system of FIG. 5A.

The sequence described in FIG. 6A may be illustrated for a better understanding. FIG. 7A shows a step in a sequence of precursor delivery operations using the multi-step precursor delivery system of FIG. 5A. The sequence illustrated in FIG. 7A-D is the sequence described in FIG. 6A. Other implementations may use the multi-step precursor delivery systems described in FIGS. 5B and 5C to perform the sequence described in FIG. 6A.

In FIGS. 7A-D, the flow paths of the precursor delivery system of FIG. 5A is illustrated using solid and broken lines. Flow paths shown in solid lines are flow paths with process gas flow through them. Flow paths shown in dotted lines are flow paths with no or minimal process gas flow through them. The valves that are shown in solid black are valves that are in an "off" configuration designed to allow no flow through the valve. The valves that are shown in a black outline with a white fill are valves that are in an "on" configuration designed to allow flow through the valve.

In FIG. 7A, which corresponds to blocks 602-08 of FIG. 6A, a multi-step precursor delivery system 700 has a first showerhead valve 724 and a second showerhead valve 728 in an "off" configuration and a first divert valve 726 and a second divert valve 730 in an "on" configuration. Consequently, the first process gas flows via a first flow path 704 through the first divert valve 726 and to a first divert dump 712A via a first divert flow path 710. The second process gas flows via a second flow path 720 through the second divert valve 730 and to a second divert dump 712B via a second divert flow path 722. In such a configuration, though the first and second process gas are still allowed to flow through the first and second flow paths, respectively, the first and second process gases are diverted to the divert dumps and not into the substrate processing chamber.

Since the first showerhead valve 724 and the second showerhead valve 728 are in an "off" configuration, there is no or minimal flow of either the first process gas or the first process gas through a showerhead flow path 706. Accordingly, there is no or minimal flow of process gas through a showerhead 708.

Figure 7B:
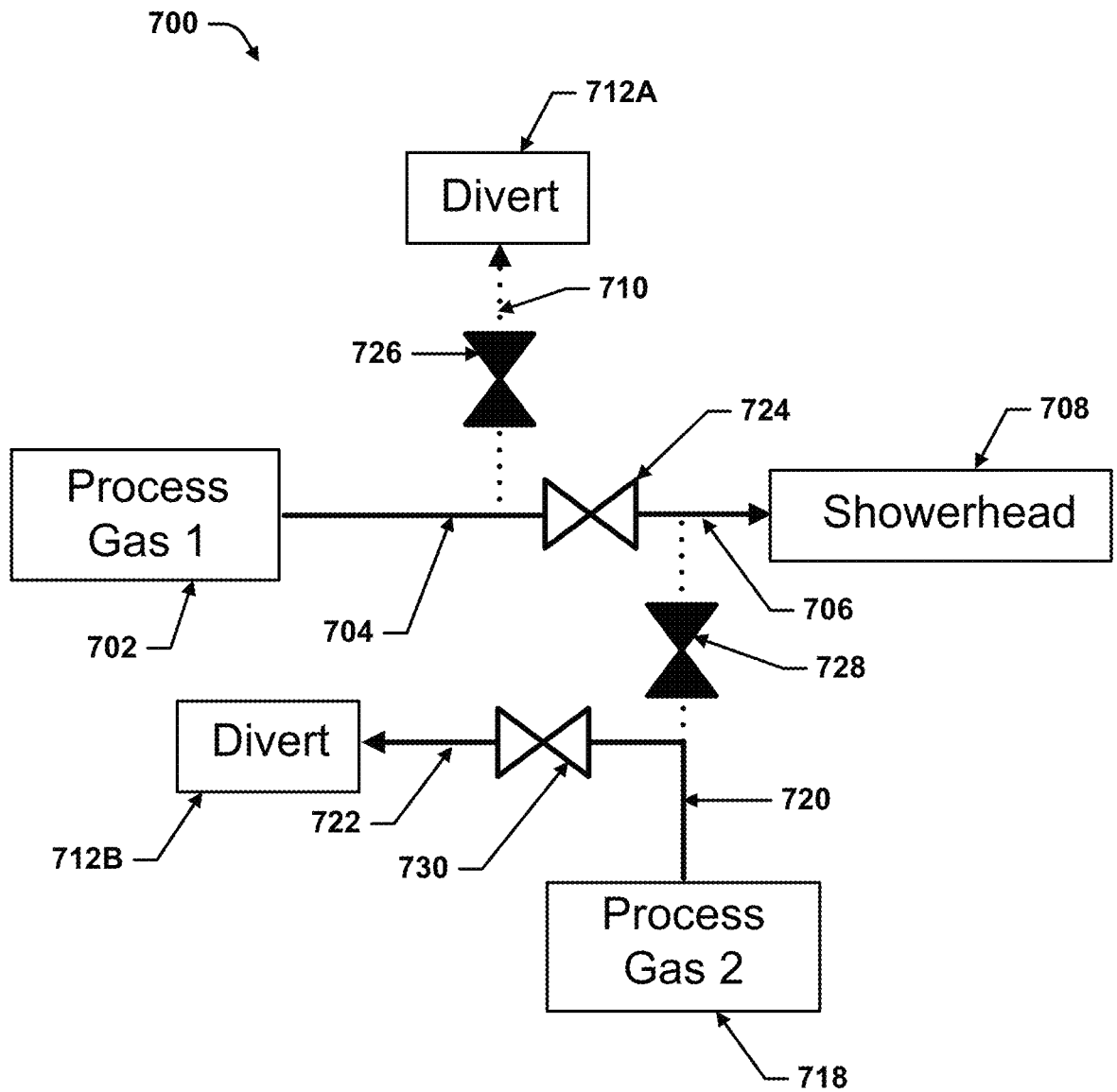
FIG. 7B shows an additional step in a sequence of precursor delivery operations using the multi-step precursor delivery system of FIG. 5A.

FIG. 7B shows an additional step in a sequence of precursor delivery operations using the multi-step precursor delivery system of FIG. 5A. FIG. 7B corresponds to block 610 of FIG. 6A.

In FIG. 7B, the first showerhead valve 724 has been switched from the "off" configuration in FIG. 7A to an "on" configuration as shown in FIG. 7B to allow the first process gas to flow from the first flow path 704 into the showerhead flow path 706 and then into the showerhead 708 to be distributed into a substrate processing chamber. Accordingly, the showerhead flow path 706 shows that there is process gas flow through the showerhead flow path 706 in FIG. 7B.

Additionally, the first divert valve 726 has been switched to an "off" configuration to prevent the first process gas flowing through to the first flow path 706 from being diverted to the first divert dump 712A. Accordingly, the first divert flow path 710 shows that there is no process gas flow in FIG. 7B.

In FIG. 7B, the second showerhead valve 728 is still in the "off" configuration and the second divert valve 730 is still in the "on" configuration. Thus, the flow of the second process gas is unchanged from that in FIG. 7A.

Figure 7C:
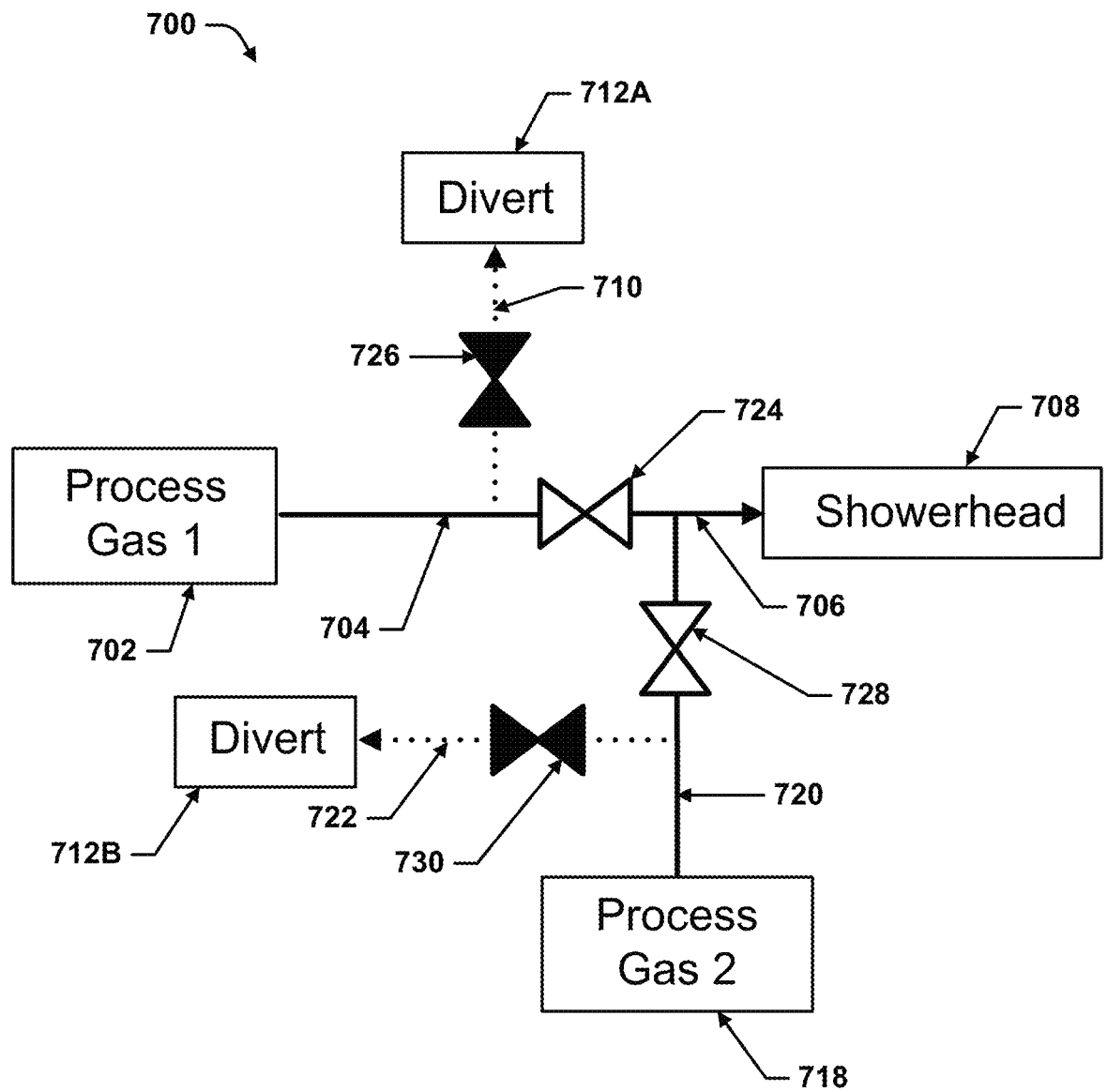
FIG. 7C shows another step in a sequence of precursor delivery operations using the multi-step precursor delivery system of FIG. 5A.

FIG. 7C shows another step in a sequence of precursor delivery operations using the multi-step precursor delivery system of FIG. 5A. FIG. 7C corresponds to block 612 of FIG. 6A.

In FIG. 7C, the second showerhead valve 728 has been switched from the "off" configuration in FIGS. 7A and 7B to an "on" configuration as shown in FIG. 7C to allow the second process gas to flow from the second flow path 720 into the showerhead flow path 706 and then into the showerhead 708 to be distributed into a substrate processing chamber. In the implementation shown in FIG. 7C, the first and second process gases may mix in the showerhead flow path 706 and/or the showerhead 708.

Additionally, the second divert valve 730 has been switched to an "off" configuration to prevent the second process gas flowing through to the first flow path 706 from being diverted to the second divert dump 712B. Accordingly, the second divert flow path 722 shows that there is no process gas flow in FIG. 7C.

Figure 7D:
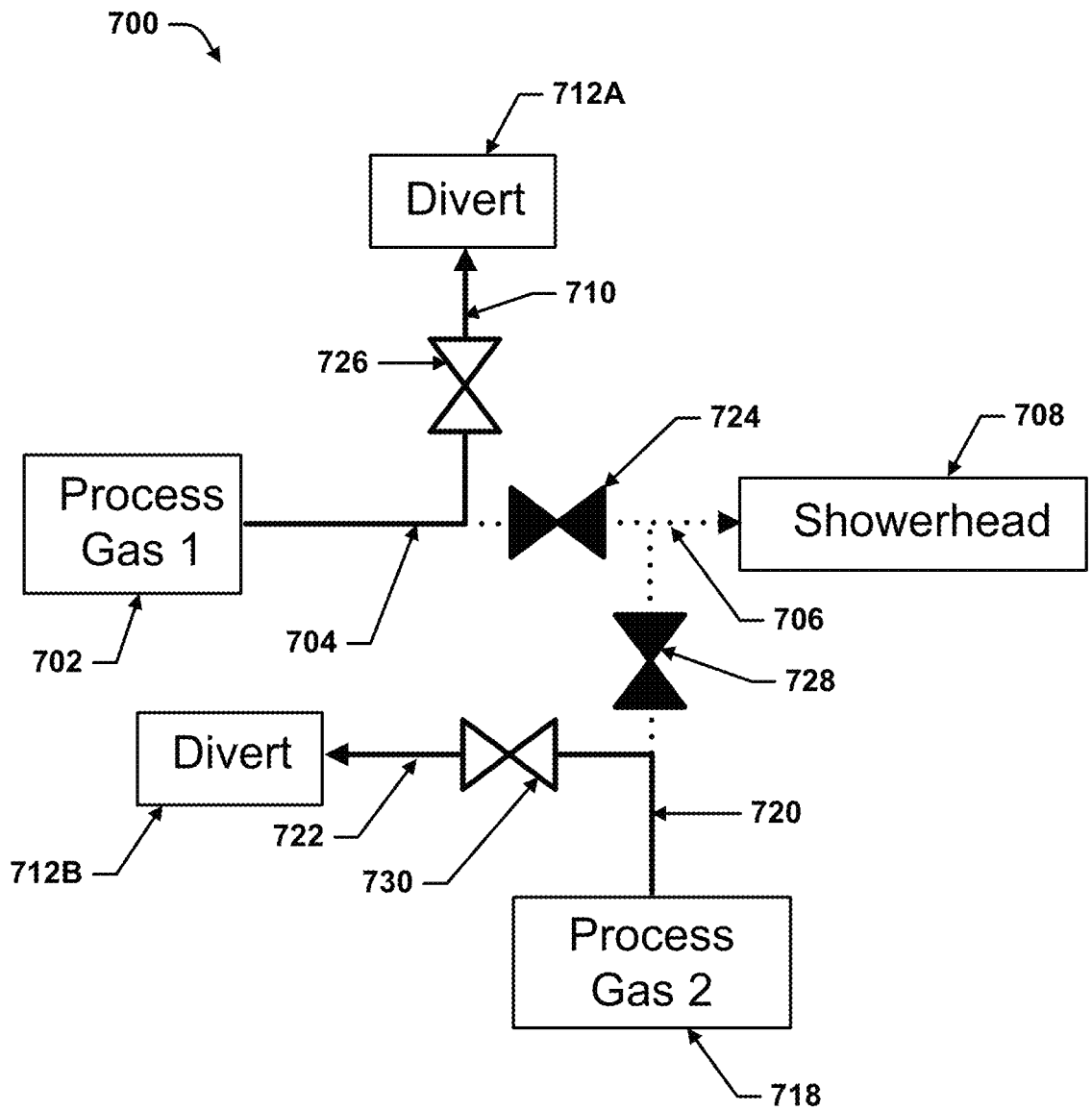
FIG. 7D shows a further step in a sequence of precursor delivery operations using the multi-step precursor delivery system of FIG. 5A.

FIG. 7D shows a further step in a sequence of precursor delivery operations using the multi-step precursor delivery system of FIG. 5A. FIG. 7D corresponds to block 614 of FIG. 6A.

In FIG. 7D, the valves of the multi-step precursor delivery system 700 have been reverted to the configuration shown in FIG. 7A. Accordingly, the first and second process gases are now flowing to the first divert dump 712A and the second divert dump 712B, respectively. No or minimal amounts of process gas are flowing into the first flow path 706.

FIGS. 7A-D are illustrative examples of a sequence utilizing an multi-step precursor delivery system. Other implementations may utilize different timings of the opening and closing of the valves and may have different structures and numbers of valves, flow paths, and other components into the multi-step precursor delivery system.

Figure 8:
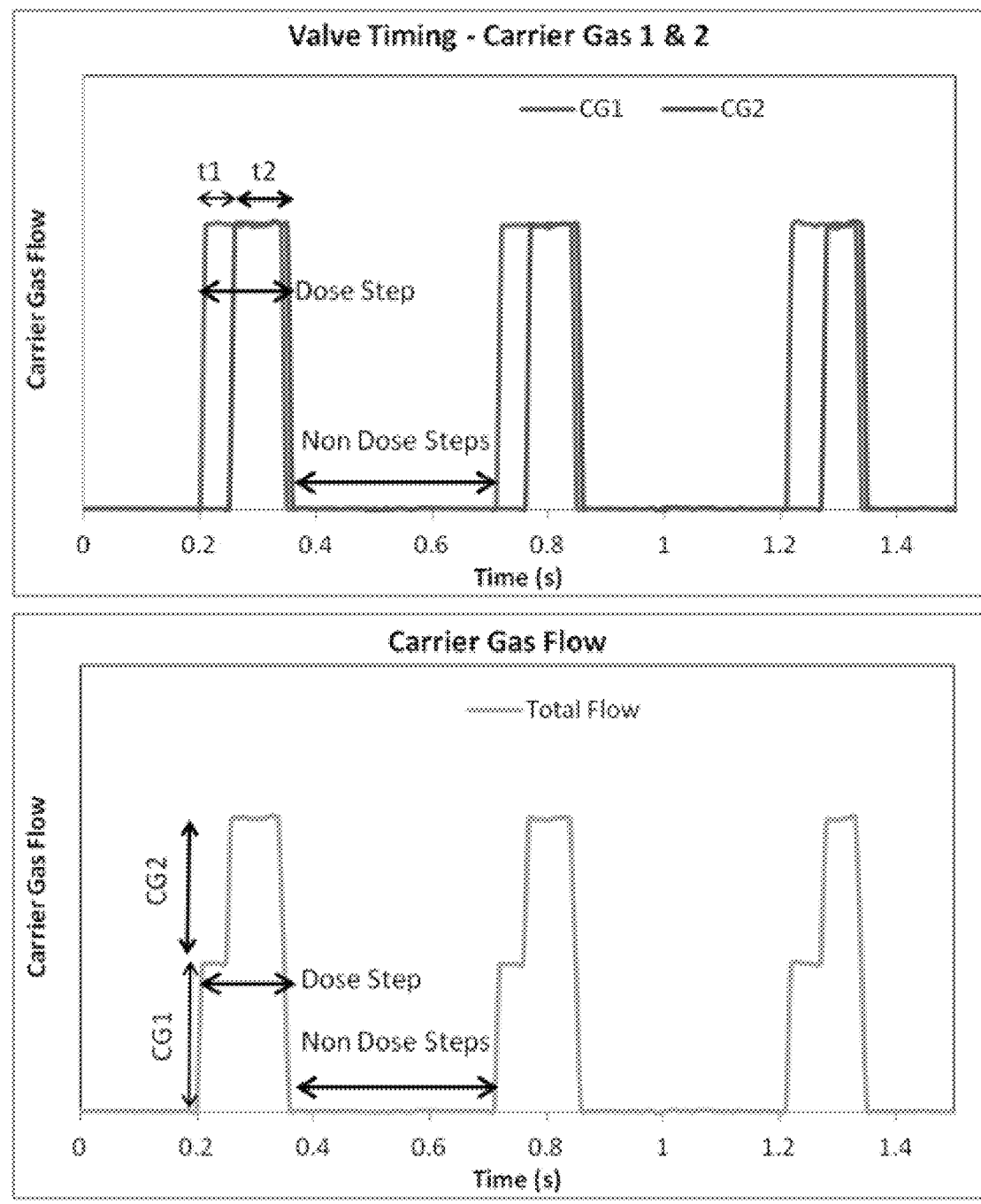
FIG. 8 is a chart showing basic sequence of operations for flowing precursor using a multi-step precursor delivery system during deposition processes.

FIG. 8 is a chart showing basic sequence of operations for flowing precursor using an multi-step precursor delivery system during deposition processes. The sequence shown in FIG. 8 corresponds to the sequence shown in FIG. 6B.

FIG. 8 shows two charts. The top chart shows the valve timing of the valves controlling the first flow path and the second flow path. FIG. 8 shows the flow of the carrier gases associated with the first and second process gases. FIG. 8 does not show the flow of the precursor carried by the first and second process gases, but, in certain implementations, the first and/or second carrier gas may carry precursor in their flow as well. The x-axes of the charts correspond to elapsed time, in seconds. The y-axes of the charts correspond to carrier gas flow.

The top chart illustrates the valve timing of the valves by showing the flow of the first and second carrier gases (labeled as CG1 and CG2, respectively) through the valve into the showerhead. When a valve, such as the valve controlling the flow of the first process gas, is in the "flow off" configuration, the chart may show the flow of the corresponding process gas, in this case the flow of the first process gas, as at 0 at the bottom of the chart. Such a situation is shown in, for example, the time period from about 0 to 0.2 seconds for the first carrier gas (CG1). When a valve is in the "flow on" configuration, the chart may show the flow of the corresponding carrier gas as at a value closer to the top of the chart. Such a situation is shown in, for example, the time period of between approximately 0.2 and 0.35 seconds for the first carrier gas.

The bottom chart illustrates the total carrier gas flow through the showerhead. When both of the valves are in "flow off" configurations, the chart may show the flow of the total carrier gas flow as at 0 at the bottom of the chart. When either or both of the valves are in "flow on" configurations, the chart may show the flow of the total carrier gas flow as a non-zero value. Such a situation is shown in, for example, the time period of between approximately 0.2 and 0.36 seconds for the total carrier gas flow. The total carrier gas flow in the bottom chart is a sum of the flow of the first and second carrier gas from the top chart at the same time.

The time period of between 0 and about 0.7 seconds illustrates an example deposition cycle. In that period, a dose step of the deposition cycle is performed in the period between approximately 0.2 and 0.36 seconds. Before that period, in the period from 0 to approximately 0.2 seconds, both valves controlling the flow of the first and second carrier gases are in "flow off" configurations.

At approximately 0.2 seconds, the valve controlling the flow of the first carrier gas to the showerhead is switched to a "flow on" configuration and the first carrier gas (along with any precursor carried by the first carrier gas) may flow into the showerhead to be distributed to a substrate located within a first substrate processing chamber. The period at 0.2 seconds may correspond to, for example, block 610 of FIG. 6B.

Between the period of approximately 0.2 and 0.25 seconds, the first carrier gas may flow into the showerhead, but the second carrier gas may not flow into the showerhead. The second carrier gas may, in some implementations, flow into a dump or vacuum.

At approximately 0.25 seconds, the valve controlling the flow of the second carrier gas to the showerhead is switched to a "flow on" configuration. The second carrier gas may then flow into any showerhead flow path and the showerhead to mix with the first carrier gas and be distributed to the substrate located within the first substrate processing chamber. At 0.25 seconds, the additional flow of the second carrier gas into the showerhead approximately doubles the flow of carrier gas through the showerhead. In other implementations, the first carrier gas flow can range from 0.3 standard liters per min (slm) to 20 slm and the second carrier gas flow range from 0.3 slm to 20 slm. The period at 0.25 seconds may correspond to, for example, block 612 of FIG. 6B.

Between the period of approximately 0.25 and 0.35 seconds, the first and second carrier gases may flow into the showerhead. At approximately 0.35 seconds, the valve controlling the flow of the first carrier gas to the showerhead is switched to a "flow off" configuration and the first carrier gas stops flowing into the showerhead. However, the second carrier gas is still flowing to the showerhead. See, for example, FIG. 10C. The period at 0.35 seconds may correspond to, for example, block 614A of FIG. 6B.

At approximately 0.36 seconds, the valve controlling the flow of the second carrier gas to the showerhead is switched to a "flow off" configuration and the second carrier gas stops flowing into the showerhead. Accordingly, at this point, no carrier gas flows into the showerhead. The second carrier gas flow may stop fractionally later than the first carrier gas to, for example, purge the showerhead and/or the substrate processing chamber of any precursor deposited by the flow of the first carrier gas. The period at 0.36 seconds may correspond to, for example, block 614B of FIG. 6B.

After 0.36 seconds and for the rest of the deposition cycle, the valves controlling the flow of the carrier gases are at a "flow off" configuration and no or minimal carrier gas flows into the showerhead.

The techniques and apparatus described herein in certain figures may show a multi-step precursor delivery system that has valves to introduce process gas and/or carrier gas at two different time intervals. In certain implementations though, the techniques and/or apparatus may be configured to introduce a third, fourth, fifth, etc. process gas and/or carrier gas at other points in time or at the same time. The introduction of the third, fourth, fifth, etc. process gas and/or carrier gas may utilize similar timing and/or valve configurations to any of the apparatus described herein.

FIG. 9A is a chart showing the wafer uniformities of example wafers processed using various precursor delivery configurations. FIG. 9A shows the thickness of four substrates processed according to various techniques of process gas delivery.

In FIG. 9A, as well as FIGS. 9B and 9C, the x-axis shows the radial distance of the point from the center of the substrate, starting at −150 mm from the center at the leftmost point of the graph, with the center, 0, in the middle of the graph, and with 150 mm away from the center at the rightmost point of the graph. The y-axis shows the normalized thickness of the processed substrate with 1.00 being the thickness at the center of the substrate and values greater than 1.00 being thicknesses that are thicker than the thickness at the center of the substrate and values less than 1.00 being thicknesses that are thinner than the thickness at the center of the substrate.

FIG. 9A shows the thickness of four different wafers, wafers 902-08, processed according to a 1600 W substrate processing operation. The process gas for wafer 902 has been delivered in one step at a flow rate of 6 standard liters per minute (slm) of process gas. As shown in the graph, the resulting wafer 902 has a "M" shaped thickness profile with the substrate increasing in thickness away from center until around +/−70 mm from center, when the thickness starts decreasing.

Wafer 904 is processed using a two-step process gas delivery technique where an initial 3 slm of process gas was delivered and then, at a later period, a further 3 slm of process gas was added to the first 3 slm of process gas. The thickness profile of the wafer 904 is still that of a "M" shaped profile, but the peaks of the "M" are much lower than the peaks in the wafer 902. The wafer 904, in general, is more uniform than the wafer 902.

Wafer 906 has been processed using a two-step process gas delivery where an initial 6 slm of process gas was delivered and then, at a later period, a further 3 slm of process gas was added to the first 6 slm of process gas. The thickness profile of the wafer 906 is "V" shaped with the low point at the center and the high points at the edges. The high points of the wafer 906 are much lower than the high points of the wafers 902 and 904. Thus, the wafer 906 is more uniform than either wafers 902 or 904.

Wafer 908 has been processed using a two-step process gas delivery where an initial 6 slm of process gas was delivered and then, at a later period, a further 6 slm of process gas was added to the first 6 slm of process gas. The thickness profile and uniformity of the wafer 908 are similar to the wafer 906. Accordingly, introducing a second stage of process gas delivery appears, in this implementation, to result in more uniform processed substrates.

FIG. 9B is an additional chart showing various wafer uniformity of example wafers processed using various precursor delivery configurations. FIG. 9B shows the thickness of four different wafers, wafers 910-16, processed according to a 1600 W substrate processing operation.

Wafer 910 has been processed using a one-step process gas delivery of 9.5 slm of process gas. The wafer 910 has a "M" shaped thickness profile, similar to the wafer 902 in FIG. 9A. However, the thickness of the substrate of the wafer 910 levels off near the edges of the substrate, possibly due to the higher flow rate of process gas delivered for the wafer 910 as compared to the flow rate of process gas delivered for the wafer 902 in FIG. 9A. Nonetheless, the wafer 910 is also not very uniform.

Wafer 912 has been processed using a two-step process gas delivery where an initial 6 slm of process gas was delivered and then, at a later period, a further 3 slm of process gas was added to the first 6 slm of process gas. The thickness profile of the wafer 912 is "V" shaped with the low point at the center and the high points at the edges. The wafer 912 is more uniform than the wafer 910.

Wafer 914 has been processed using a two-step process gas delivery where an initial 9.5 slm of process gas was delivered and then, at a later period, a further 9 slm of process gas was added to the first 9.5 slm of process gas. The thickness profile of the wafer 914 is "V" shaped and similar to the thickness profile of the wafer 912, with the low point at the center and the high points at the edges. The profile of the wafer 914 though, is fairly flat from the center until about half a radius away from the center, before then increasing in thickness to the edges of the substrate.

Wafer 916 has been processed using a two-step process gas delivery where an initial 6 slm of process gas was delivered and then, at a later period, a further 6 slm of process gas was added to the first 6 slm of process gas. The thickness profile and uniformity of the wafer 916 is similar to the profiles of the wafers 912 and 914. The thickness profiles of the wafers 912-16 show that introducing a second stage of process gas delivery may result in processed substrates that are more uniform. Additionally, the thickness profiles of the wafers 912-16 may suggest that calibrating the volume of process gas delivered in the first and/or second stages may result in even more uniform thickness profiles.

FIG. 9C is another chart showing various wafer uniformity of example wafers processed using various precursor delivery configurations. FIG. 9C shows the thickness of three different wafers, wafers 918-22, processed according to a 500 W substrate processing operation.

Wafer 918 has been processed with a delivery of one step of 3 slm of process gas. The wafer 918 has a "M" shaped thickness profile, similar to the wafer 902 in FIG. 9A. Wafer 920 also has a one-step process gas delivery where 6 slm of process gas, double that used for the wafer 918, is delivered. The wafer 920 also has a "M" shaped thickness profile, though the peak of the profile for the wafer 920 is lower than the peak of the profile for the wafer 918.

Wafer 922 has been processed using a two-step process gas delivery where an initial 3 slm of process gas was delivered and then, at a later period, a further 3 slm of process gas was added to the first 3 slm of process gas. Thus, the wafer 922 has a total of 6 slm of process gas being delivered during the second stage of process gas delivery. The thickness profile of the wafer 922 is similar to the thickness profile of the wafer 920, but has a lower peak than that for the wafer 920. Thus, delivering process gas over two stages instead of over one stage, even when the total process gas delivered during the cycle is less for the two stage implementation (as the wafer 922 experiences an initial 3 slm of process gas delivery in the first stage rather than a full 6 slm from the beginning), may result in a more uniform processed substrate.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the disclosure.

What is claimed is:

1. A method of controlling a precursor dose to a substrate in a processing chamber during an atomic layer deposition (ALD) process, the method comprising:

(a) flowing a first process gas to the substrate for a first period of a dose phase of an ALD deposition cycle, wherein the first process gas includes a first carrier gas and the precursor;

(b) flowing a second process gas to the substrate for a second period of the dose phase of the ALD deposition cycle, wherein the second period begins after the first period begins, the first and second periods at least partially overlap such that the first process gas and the second process gas are both flowing to the substrate at the same time during such overlap, the second process gas is only a second carrier gas, and the second process gas mixes with the first process gas before delivery to the substrate for at least a portion of a period where the second period overlaps with the first period;

(c) stopping, after at least the portion of overlap that the first process gas and the second process gas are both flowing to the substrate at the same time, the flow of the first process gas and the second process gas to the substrate;

(d) flowing, after (c), a purge gas into the processing chamber;

(e) activating, after (d), precursor adsorbed onto the substrate;

(f) flowing, after (e), the purge gas into the processing chamber; and (g) repeating (a)-(f) for the substrate during a separate ALD deposition cycle.

2. The method of claim 1, wherein the volumetric flow rate of total process gas increases from (a) to (b).

3. The method of claim 1, wherein the second process gas comprises helium.

4. The method of claim 1, wherein the second process gas comprises one or more of: argon, nitrogen (N2), oxygen (O2), nitrous oxide (N2O), helium.

5. The method of claim 1, wherein the purge gas is different than the second process gas.

6. The method of claim 1, wherein the purge gas is the same as the second process gas.

7. The method of claim 1, wherein (c) further comprises stopping the flow of the first process gas before stopping the flow of the second process gas.

8. The method of claim 1, wherein (c) further comprises stopping the flow of the second process gas before stopping the flow of the first process gas.

9. The method of claim 1, wherein (c) further comprises simultaneously stopping the flow of the first process gas and the flow of the second process gas.

10. The method of claim 1, further comprising:
(h) flowing a third process gas to the substrate for a third period of the dose phase of the ALD deposition cycle, wherein the third period begins after the first period begins, the first and third periods at least partially overlap such that the first process gas and the third process gas are both flowing to the substrate at the same time during such overlap, the third process gas comprises a third carrier gas, the third process gas mixes with the first process gas before delivery to the substrate for at least a portion of a period where the third period overlaps with the first period, and the volumetric flow rate of total process gas increases from (a) to (h),
wherein (c) further comprises stopping, after at least the portion of overlap that the first process gas and the third process gas are both flowing to the substrate at the same time, the flow of the third process gas.

11. The method of claim 1, wherein the first process gas flows to the substrate through a first flow path fluidically connected to a showerhead through a showerhead flow path, and wherein the showerhead is configured to deliver process gas to the substrate.

12. An apparatus comprising:
a substrate holder in a processing chamber configured to receive a substrate;
a showerhead with a showerhead flow path, configured to deliver process gas to the substrate received by the substrate holder in the processing chamber;
a first process gas source fluidically connected to the showerhead through the showerhead flow path;
a second process gas source fluidically connected to the showerhead through the showerhead flow path;
a purge gas source fluidically connected to the showerhead through the showerhead flow path; and
one or more controllers configured to:
(a) flow a first process gas to the substrate for a first period of a dose phase of an atomic layer deposition (ALD) cycle, wherein the first process gas includes a first carrier gas and a precursor,
(b) flow a second process gas to the substrate for a second period of the dose phase of the ALD deposition cycle, wherein the second period begins after the first period begins, the first and second periods at least partially overlap such that the first process gas and the second process gas are both flowing to the substrate at the same time during such overlap, the second process gas is only a second carrier gas, the second process gas mixes with the first process gas before delivery to the substrate for at least a portion of a period where the second period overlaps with the first period;
(c) stop, after at least the portion of overlap that the first process gas and the second process gas are both flowing to the substrate at the same time, the flow of the first process gas and the second process gas to the substrate;
(d) flow, after (c), a purge gas into the processing chamber;
(e) activate, after (d), precursor adsorbed onto the substrate;
(f) flow, after (e), the purge gas into the processing chamber; and
(g) repeat (a)-(f) for the substrate during a separate ALD deposition cycle.

13. The apparatus of claim 12, wherein the volumetric flow rate of total process gas increases from (a) to (b).

14. The apparatus of claim 12, wherein the second process gas comprises helium.

15. The apparatus of claim 12, wherein the second process gas comprises one or more of: argon, nitrogen (N2), oxygen (O2), nitrous oxide (N2O), helium.

16. The apparatus of claim 12, wherein the purge gas is different than the second process gas.

17. The apparatus of claim 12, wherein the purge gas is the same as the second process gas.

18. The apparatus of claim 12, wherein (c) further comprises stop the flow of the first process gas before the flow of the second process gas is stopped.

19. The apparatus of claim 12, wherein (c) further comprises stop the flow of the second process gas before the flow of the first process gas is stopped.

20. The apparatus of claim 12, wherein (c) further comprises simultaneously stop the flow of the first process gas and the flow of the second process gas.

21. Apparatus of claim 12, further comprising a third process gas fluidically connected to the first flow path, wherein:
the one or more controllers are further configured to:
(h) flow a third process gas to the substrate for a third period of the dose phase of the ALD deposition cycle, wherein the third period begins after the first period begins, the first and third periods at least partially overlap such that the first process gas and the third process gas are both flowing to the substrate at the same time during such overlap, the third process gas comprises a carrier gas, the third process gas mixes with the first process gas before delivery to the substrate for at least a portion of a period where the third period overlaps with the first period, and the volumetric flow rate of total process gas increases from (a) to (h), and
(c) further comprises stop, after at least the portion of overlap that the first process gas and the third process gas are both flowing to the substrate at the same time, the flow of the third process gas.

22. An apparatus comprising:
a substrate holder in a processing chamber configured to receive a substrate;
a showerhead configured to deliver process gas to the substrate received by the substrate holder in the processing chamber;
a first process gas source fluidically connected to the showerhead;
a second process gas source fluidically connected to the;
a purge gas source fluidically connected to the showerhead; and
one or more controllers configured to:
(a) flow a first process gas to the substrate for a first period of a dose phase of an atomic layer deposition (ALD) cycle, wherein the first process gas includes a first carrier gas and a precursor,
(b) flow a second process gas to the substrate for a second period of the dose phase of the ALD deposition cycle, wherein the second period begins after the first period begins, the first and second periods at least partially overlap such that the first process gas and the second process gas are both flowing to the substrate at the same time during such overlap, the second process gas comprises a second carrier gas, the second process gas mixes with the first process gas before delivery to the substrate for at least a portion of a period where the second period overlaps with the first period;

(c) stop, after at least the portion of overlap that the first process gas and the second process gas are both flowing to the substrate at the same time, the flow of the first process gas and the second process gas to the substrate;

(d) flow, after (c), a purge gas into the processing chamber;

(e) activate, after (d), precursor adsorbed onto the substrate;

(f) flow, after (e), the purge gas into the processing chamber; and (g) repeat (a)-(f) for the substrate during a separate ALD deposition cycle.

23. The apparatus of claim 22, wherein the volumetric flow rate of total process gas increases from (a) to (b).

24. The apparatus of claim 22, wherein the second process gas is only the second carrier gas.

25. The apparatus of claim 22, wherein (c) further comprises stop the flow of the first process gas before the flow of the second process gas is stopped.

26. The apparatus of claim 22, wherein (c) further comprises stop the flow of the second process gas before the flow of the first process gas is stopped.

27. The apparatus of claim 22, wherein (c) further comprises simultaneously stop the flow of the first process gas and the flow of the second process gas.

28. The apparatus of claim 22, wherein:
the showerhead comprises a showerhead flow path,
the first process gas source is fluidically connected to the showerhead through the showerhead flow path,
the second process gas source is fluidically connected to the showerhead through the showerhead flow path, and
the purge gas source is fluidically connected to the showerhead through the showerhead flow path.

* * * * *